(12) United States Patent
Wang et al.

(10) Patent No.: US 10,978,538 B2
(45) Date of Patent: Apr. 13, 2021

(54) DISPLAY APPARATUS

(71) Applicant: Samsung Display Co., Ltd., Yongin-si (KR)

(72) Inventors: Seongmin Wang, Yongin-si (KR); Youngin Hwang, Yongin-si (KR); Yongho Yang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 14 days.

(21) Appl. No.: 16/365,757

(22) Filed: Mar. 27, 2019

(65) Prior Publication Data
US 2020/0083309 A1 Mar. 12, 2020

(30) Foreign Application Priority Data
Sep. 7, 2018 (KR) .................. 10-2018-0107379

(51) Int. Cl.
*H01L 27/32* (2006.01)

(52) U.S. Cl.
CPC ...... *H01L 27/3272* (2013.01); *H01L 27/3265* (2013.01); *H01L 27/3276* (2013.01)

(58) Field of Classification Search
CPC ............. H01L 27/3272; H01L 27/3265; H01L 27/3276
USPC ........................................................ 257/43
See application file for complete search history.

(56) References Cited

U.S. PATENT DOCUMENTS

| | | | |
|---|---|---|---|
| 9,397,124 B2 | 7/2016 | Choi et al. | |
| 9,881,986 B2 | 1/2018 | Cho et al. | |
| 10,381,426 B2 | 8/2019 | Ka et al. | |
| 2013/0026929 A1 | 1/2013 | Kasai | |
| 2015/0137101 A1* | 5/2015 | Choi | ............. H01L 27/3258 257/40 |
| 2015/0187750 A1* | 7/2015 | Kim | ............. G02F 1/136286 257/43 |
| 2016/0005803 A1* | 1/2016 | Ryu | ............. H01L 27/3258 257/40 |
| 2016/0064421 A1* | 3/2016 | Oh | ............. H01L 27/1218 257/43 |
| 2017/0117343 A1 | 4/2017 | Oh et al. | |
| 2017/0162115 A1* | 6/2017 | Chen | ............. H01L 27/1222 |
| 2017/0338252 A1* | 11/2017 | Lee | ............. H01L 29/78633 |
| 2018/0033849 A1* | 2/2018 | Noh | ............. H01L 27/1222 |
| 2018/0122835 A1* | 5/2018 | Watakabe | ............. H01L 21/31116 |
| 2018/0151125 A1* | 5/2018 | Lee | ............. G09G 3/3233 |

(Continued)

FOREIGN PATENT DOCUMENTS

| | | |
|---|---|---|
| EP | 3264408 | 3/2018 |
| JP | 2013-50697 | 3/2013 |
| KR | 10-2015-0101415 | 9/2015 |

(Continued)

*Primary Examiner* — Igwe U Anya
(74) *Attorney, Agent, or Firm* — H.C. Park & Associates, PLC

(57) ABSTRACT

A display apparatus includes: a first thin-film transistor (TFT) including a first semiconductor layer including a silicon semiconductor; a second TFT including a second semiconductor layer including an oxide semiconductor; a first shielding layer configured to overlap the first TFT and positioned between a substrate and the first TFT; and a second shielding layer configured to overlap the second TFT and positioned between the substrate and the second TFT.

20 Claims, 23 Drawing Sheets

(56) References Cited

U.S. PATENT DOCUMENTS

2018/0277661 A1\* 9/2018 Nagayama ............ H01L 29/458

FOREIGN PATENT DOCUMENTS

| KR | 10-2017-0064128 | 6/2017 |
| KR | 10-2017-0129508 | 11/2017 |

\* cited by examiner

DISPLAY APPARATUS

CROSS-REFERENCE TO RELATED APPLICATION

This application claims priority from and the benefit of Korean Patent Application No. 10-2018-0107379, filed on Sep. 7, 2018, which is hereby incorporated by reference for all purposes as if fully set forth herein.

BACKGROUND

Field

Exemplary embodiments of the invention relate generally to a display apparatus.

Discussion of the Background

Display apparatuses, such as organic light-emitting display apparatuses, liquid crystal display (LCD) apparatuses, and the like, include an array substrate including a thin-film transistor (TFT), a capacitor, and a plurality of wirings. The array substrate includes fine patterns, such TFTs, capacitors, and wirings, and such a display apparatus is driven by complicated connections between the TFT, the capacitor, and the wirings.

As demand for display apparatuses having compact sizes and high resolution has increased, demand for efficient space arrangement between the TFT, the capacitor, and the wirings of the display apparatus, a connection structure thereof, a driving method, and quality improvement of a realized image is also increasing.

The above information disclosed in this Background section is only for understanding of the background of the inventive concepts, and, therefore, it may contain information that does not constitute prior art.

SUMMARY

Devices constructed according to exemplary implementations of the invention disclose a display apparatus including a transistor with an improved characteristics.

Additional features of the inventive concepts will be set forth in the description which follows, and in part will be apparent from the description, or may be learned by practice of the inventive concepts.

According to one or more embodiments, a display apparatus includes: a first thin-film transistor (TFT) (e.g., T1 discussed with reference to drawings) including a first semiconductor layer including a silicon semiconductor; a second TFT (e.g., T3 discussed with reference to drawings) including a second semiconductor layer including an oxide semiconductor, one end of the second semiconductor layer being connected to one end of the first semiconductor layer of the first TFT and the other end of the second semiconductor layer being connected to a gate electrode of the first TFT; a first shielding layer configured to overlap the first TFT, the first shielding layer interposed between a substrate and the first TFT; and a second shielding layer configured to overlap the second TFT, the first shielding layer interposed between the substrate and the second TFT.

The first shielding layer and the second shielding layer may be positioned on the same layer.

The first shielding layer and the second shielding layer may be positioned on different layers.

The second shielding layer may be positioned on the same layer as the first semiconductor layer.

The second shielding layer may be positioned on the same layer as a gate electrode of the first TFT.

The display apparatus may further include a capacitor overlapping the first TFT, wherein the second shielding layer may be positioned on the same layer as one electrode of the capacitor.

The display apparatus may further include a capacitor overlapping the second shielding layer and positioned between the second shielding layer and the second TFT.

One electrode of the capacitor may be positioned on the same layer as one of the first semiconductor layer of the first TFT and a gate electrode of the first TFT overlapping a channel region of the first semiconductor layer.

The display apparatus may further include at least one of: a first touch sensor overlapping the first TFT; and a second touch sensor overlapping the second shielding layer and positioned between the second shielding layer and the substrate.

The first shielding layer may be electrically connected to a power line for applying a power voltage.

The first shielding layer may be electrically connected to a power line for applying an initialization voltage.

The first shielding layer may be electrically connected to the first semiconductor layer.

The first shielding layer may be electrically connected to a gate electrode of the first TFT.

The second shielding layer may be electrically connected to a power line for applying an initialization voltage.

The second shielding layer may be electrically connected to the gate electrode of the second TFT.

The first TFT may be a driving transistor, and the second TFT may be a switching transistor.

The first TFT may be a switching transistor, and the second TFT may be a driving transistor.

According to one or more embodiments, a display apparatus includes: a first thin-film transistor (TFT) including a first semiconductor layer including a silicon semiconductor; a second TFT including a second semiconductor layer including an oxide semiconductor; a capacitor overlapping the first TFT; a first shielding layer overlapping the first TFT, the first shielding layer interposed between a substrate and the first TFT; and a second shielding layer overlapping the second TFT, the second shielding layer interposed between the substrate and the second TFT.

The same voltage may be applied to the first shielding layer and the second shielding layer.

Different voltages may be applied to the first shielding layer and the second shielding layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
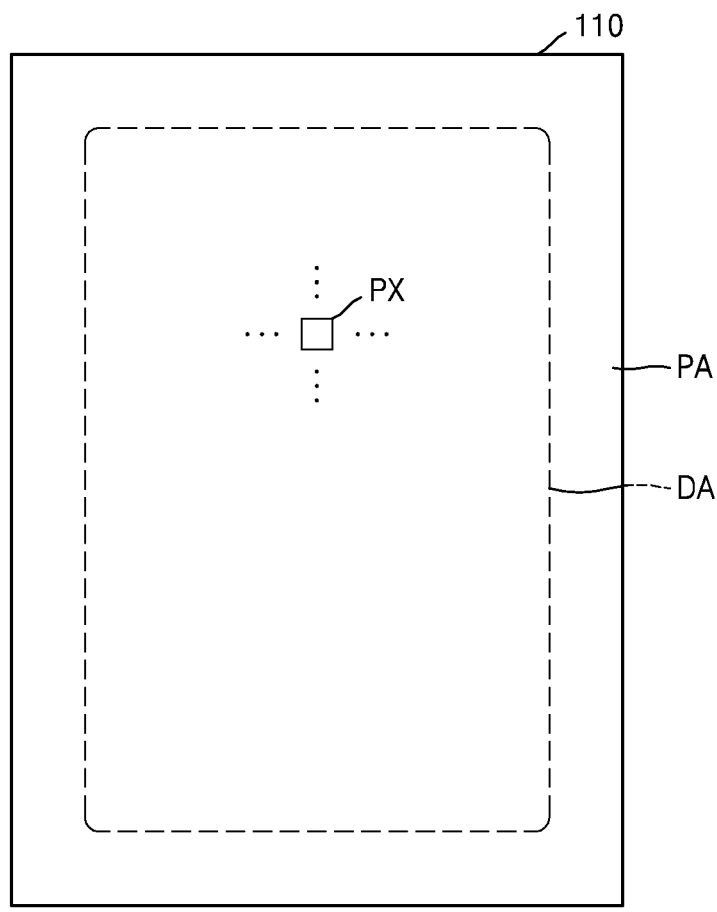
FIG. 1 is a plan view schematically illustrating a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view schematically illustrating a display apparatus according to an exemplary embodiment.

Pixels PX including various display devices, such as organic light-emitting devices (OLEDs), may be positioned in a first direction and a second direction in a display area DA of a substrate 110. The pixels PX may include a display device and a pixel circuit for driving the display device. Various wirings and driving circuits, i.e., a scan driver, a multiplexer (MUX), and a data driver for transmitting electrical signals to the display area DA may be positioned in a peripheral area PA of the substrate 110.

The pixel circuit and a driving circuit may be implemented using a plurality of thin-film transistors (TFTs) and formed above the substrate 110. The plurality of TFTs may be implemented with an oxide semiconductor TFT or a silicon (Si) semiconductor TFT according to a semiconductor material for forming an active layer. Proper types of TFTs that satisfy required criteria, such as a leakage current, a switching speed, a drive strength, and uniformity, may be used in the pixel circuit and the driving circuit so that display performance may be enhanced.

In the display apparatus according to embodiments, at least two types of TFTs may be formed above the substrate 110. At least two types of TFTs include a silicon (Si) semiconductor TFT having a semiconductor layer including a Si material and an oxide semiconductor TFT having a semiconductor layer including an oxide. The Si semiconductor TFT may be a low temperature poly-silicon (LTPS) TFT, an amorphous silicon (a-si) TFT, or a polycrystalline silicon (p-si) TFT.

Because the Si material has relatively high electron mobility and thus has low-energy power consumption and excellent reliability, the Si semiconductor TFT may be applied to a driving TFT of the pixel circuit and a TFT of the driving circuit.

The oxide semiconductor material has a lower off-current than that of the Si material. Thus, the oxide semiconductor TFT may be applied to a switching TFT that has a short on-time and maintains a long off-time. Also, because the off-current is small and the size of an auxiliary capacity may be reduced, the oxide semiconductor TFT is suitable for a high-resolution display apparatus.

In the display apparatus according to one or more embodiments, different types of TFTs, such as an oxide semiconductor TFT (hereinafter, referred to as an 'oxide TFT') and a silicon semiconductor TFT (hereinafter, referred to as a 'Si TFT'), may be applied to the pixel circuit and the driving circuit. In one or more embodiments, the oxide TFT may be a n-channel TFT, i.e., a n-channel metal oxide semiconductor (NMOS) TFT, and the Si TFT may be a p-channel or n-channel TFT, i.e., a p-channel metal oxide semiconductor (PMOS) TFT or an NMOS TFT.

In the display apparatus according to various embodiments, different types of silicon TFTs and oxide TFTs are positioned above the same substrate so that an optimum function may be provided.

FIGS. 2A, 2B, 2C, and 2D are cross-sectional views illustrating a pixel structure constructed according to an exemplary embodiment. FIGS. 2A, 2B, 2C, and 2D illustrate embodiments in which positions of second shielding layers are different from each other. Hereinafter, the exemplary embodiments will be described based on FIG. 2A, and in FIGS. 2B through 2D, a redundant description of FIG. 2A will be omitted.

Figure 2A:
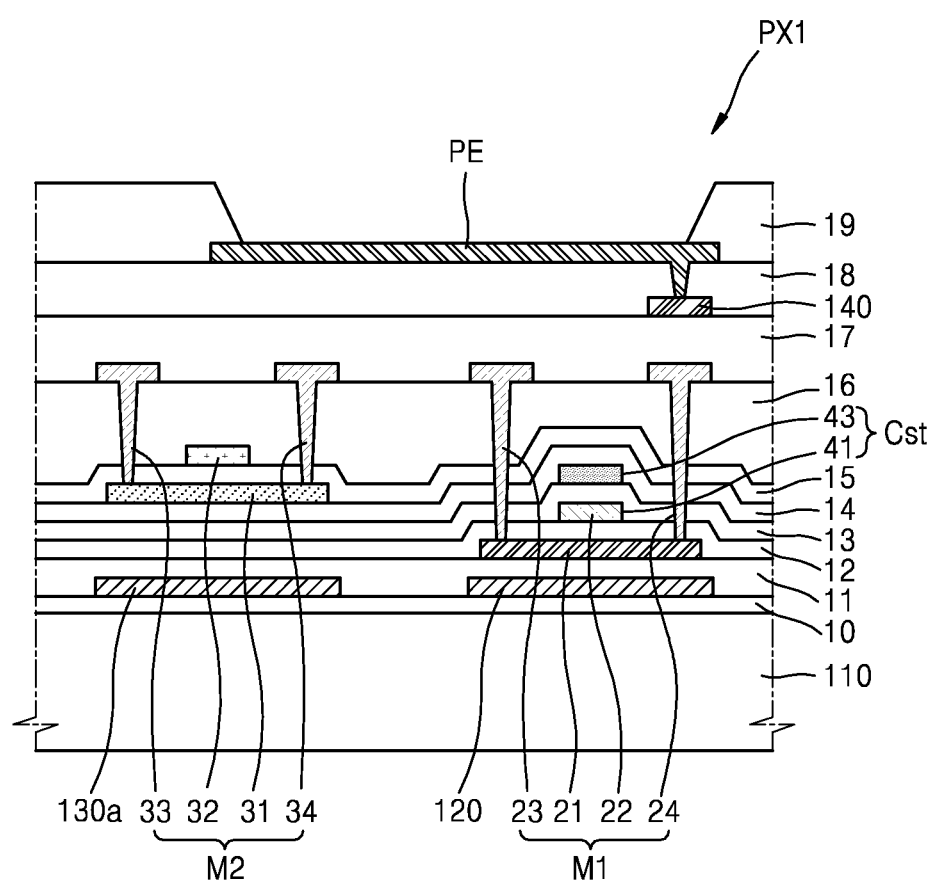
FIGS. 2A, 2B, 2C, and 2D are cross-sectional views illustrating a pixel structure constructed according to an exemplary embodiment.

Referring to FIG. 2A, a pixel PX1 according to an exemplary embodiment may include a first transistor M1, a second transistor M2, and a capacitor Cst, which are positioned above the substrate 110. A top surface of the substrate 110 may be defined by the first direction (see FIG. 1) and the second direction (see FIG. 1).

The first transistor M1 and the second transistor M2 may be positioned on different layers. The second transistor M2 may be positioned on an upper layer of the first transistor M1. The capacitor Cst may overlap the first transistor M1. The first transistor M1 may be a Si TFT. The second transistor M2 may be an oxide TFT.

The first transistor M1 may include a first semiconductor layer 21, a first gate electrode 22, a first source electrode 23, and a first drain electrode 24. The second transistor M2 may include a second semiconductor layer 31, a second gate electrode 32, a second source electrode 33, and a second drain electrode 34. The capacitor Cst may include a first electrode 41 and a second electrode 43.

A first shielding layer 120 may be positioned between the first transistor M1 and the substrate 110, and a second shielding layer 130a may be positioned between the second transistor M2 and the substrate 110. The first shielding layer 120 may be positioned to overlap the first transistor M1, and the second shielding layer 130a may be positioned to overlap the second transistor M2.

Charge may be induced to the substrate 110 due to light introduced from the outside and a variation of voltages applied to circuit devices, which may affect a semiconductor layer of a TFT. Thus, characteristics of the TFT, such as a threshold voltage, are changed so that an afterimage may occur and/or luminous uniformity may be lowered.

In an exemplary embodiment, each of the first and second shielding layers 120 and 130a may be positioned between the substrate 110, the first transistor M1, and the second transistor M2, and an appropriate voltage is applied to each of the first and second shielding layers 120 and 130a according to a semiconductor type and a channel type of a transistor so that the first transistor M1 and the second transistor M2 are not affected by external light and an electric potential of the substrate 110 and transistor characteristics may be enhanced.

A buffer layer 10 may be positioned on the substrate 110, and the first transistor M1, the second transistor M2, and the capacitor Cst may be positioned on the buffer layer 10.

The first shielding layer 120 in a region corresponding to the first transistor M1 and the second shielding layer 130a in a region corresponding to the second transistor M2 may be positioned on the buffer layer 10.

Each of the first shielding layer 120 and the second shielding layer 130a may include metal and may have a single layer or multi-layer structure. For example, the first shielding layer 120 and the second shielding layer 130a may have a single layer structure including molybdenum (Mo). In another exemplary embodiment, the first shielding layer 120 and the second shielding layer 130a may have a three-layer structure including a first layer including titanium (Ti), a second layer including aluminum (Al), and a third layer including Ti, which are sequentially positioned on the buffer layer 10.

A first insulating layer 11 may be positioned on the first shielding layer 120 and the second shielding layer 130a. The first semiconductor layer 21 of the first transistor M1 may be positioned on the first insulating layer 11. The first semiconductor layer 21 may include polysilicon.

A second insulating layer 12 may be positioned on the first semiconductor layer 21. A first gate electrode 22 may be positioned on the second insulating layer 12. The first gate electrode 22 may function as the first electrode 41 of the capacitor Cst. A third insulating layer 13 may be positioned on the first gate electrode 22. The second electrode 43 of the capacitor Cst may be positioned on the third insulating layer 13. A fourth insulating layer 14 may be positioned on the second electrode 43 of the capacitor Cst.

The second semiconductor layer 31 of the second transistor M2 may be positioned on the fourth insulating layer 14. The second semiconductor layer 31 may include an oxide semiconductor. The oxide semiconductor may include a metal oxide, such as zinc (Zn), indium (In), gallium (Ga), tin (Sn), and Ti, or a mixture of metal, such as Zn, In, Ga, Sn, Ti, and oxides thereof. For example, the oxide semiconductor may be formed of a Zn-oxide-based material, for example, a Zn oxide, an In—Zn oxide, or a Ga—In—Zn oxide. In some exemplary embodiments, the oxide semiconductor may be an In-Ga—Zn-O (IGZO) semiconductor in which metals, such as In and Ga, are contained in ZnO.

A fifth insulating layer 15 may be positioned on the second semiconductor layer 31. The second gate electrode 32 may be positioned on the fifth insulating layer 15. A sixth insulating layer 16 may be positioned on the second gate electrode 32.

The first source electrode 23 and the first drain electrode 24 of the first transistor M1 and the second source electrode 33 and the second drain electrode 34 of the second transistor M2 may be positioned on the sixth insulating layer 16.

A seventh insulating layer 17 may be positioned above the first transistor M1 and the second transistor M2. A conductive layer 140 may be positioned on the seventh insulating layer 17. The conductive layer 140 may be a connecting electrode for electrically connecting one electrode among the plurality of transistors and the capacitor Cst of the pixel PX including the first transistor M1 and the second transistor M2 to a pixel electrode PE. An eighth insulating layer 18 may be positioned on the conductive layer 140. The pixel electrode PE may be positioned on the eighth insulating layer 18. A ninth insulating layer 19 may be positioned at edges of the pixel electrode PE. The pixel electrode PE may be electrically connected to the conductive layer 140.

Figure 2B:
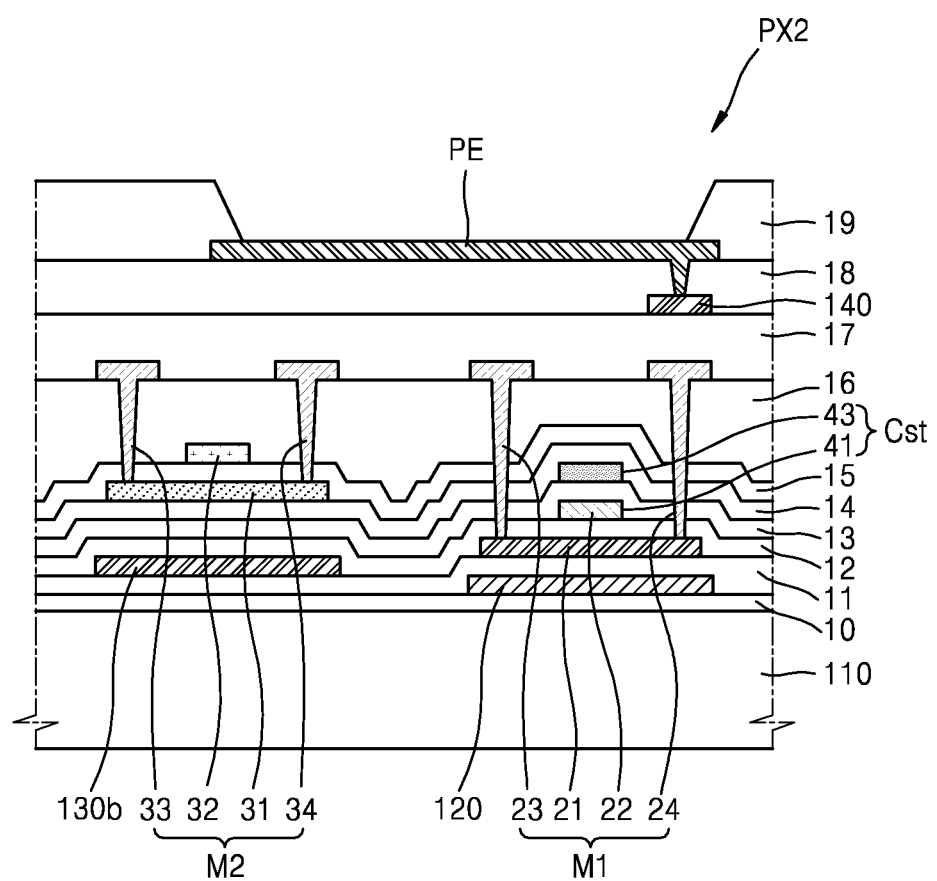

In a pixel PX2 illustrated in FIG. 2B, the second shielding layer 130b is formed on the same layer as the first semiconductor layer 21 of the first transistor M1. The first semiconductor layer 21 and the second shielding layer 130b of the first transistor M1 may be positioned on the first insulating layer 11. The first semiconductor layer 21 may include polysilicon.

The first shielding layer 120 may include metal and have a single layer or multi-layer structure. The second shielding layer 130b may be formed of the same material as that of the first semiconductor layer 21 and may include polysilicon. The second insulating layer 12 may be positioned on the first semiconductor layer 21 and the second shielding layer 130b.

Figure 2C:
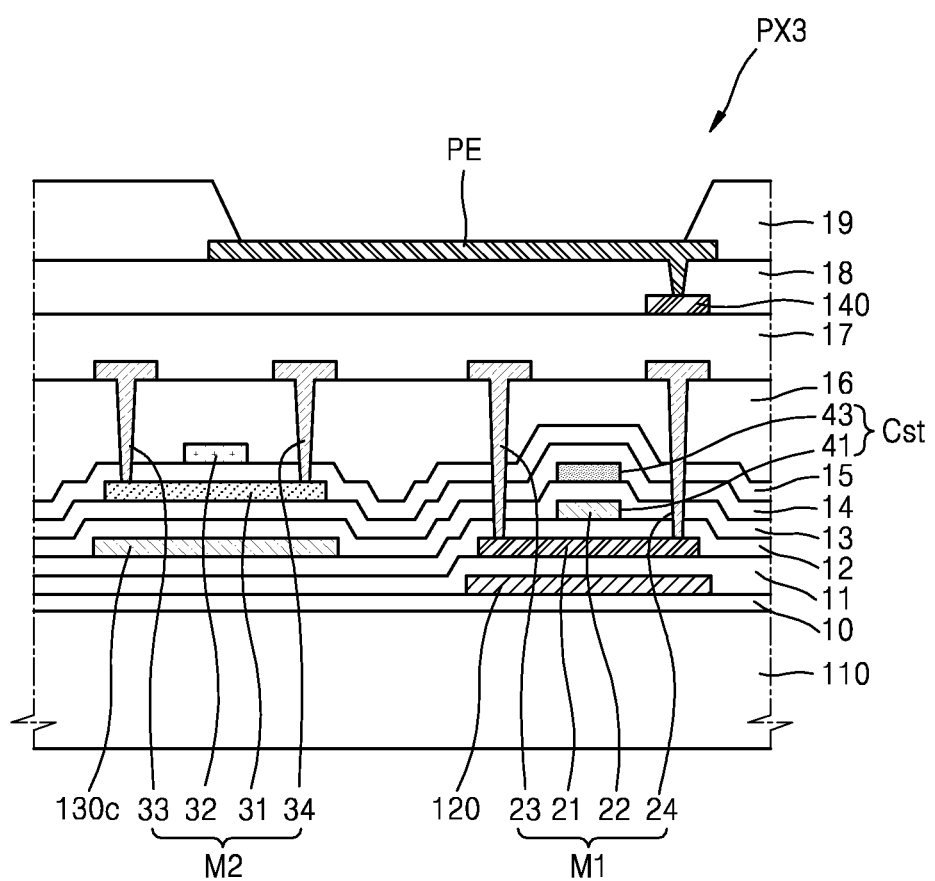

In a pixel PX3 illustrated in FIG. 2C, the second shielding layer 130c is formed on the same layer as the first gate electrode 22 of the first transistor M1. The first gate electrode 22 and the second shielding layer 130c of the first transistor M1 may be positioned on the second insulating layer 12.

The first shielding layer 120 may include metal and may have a single layer or multi-layer structure. The second shielding layer 130c may include the same material as that of the first gate electrode 22. The third insulating layer 13 may be positioned on the first gate electrode 22 and the second shielding layer 130c.

Figure 2D:
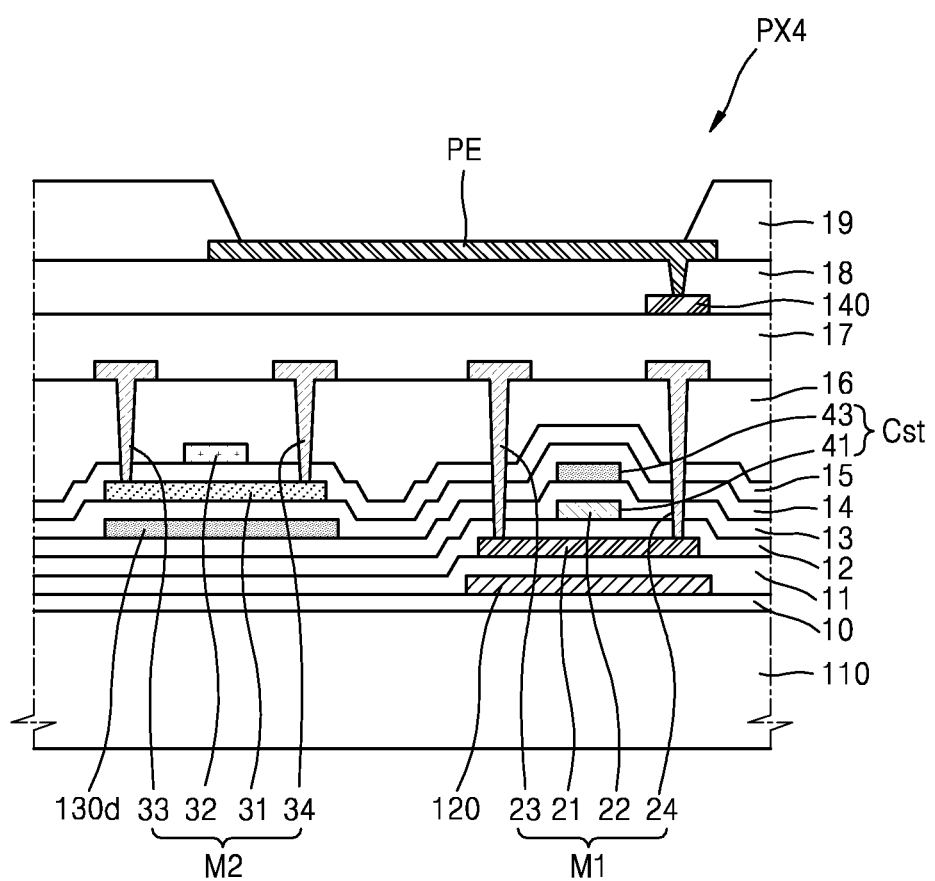

In a pixel PX4 illustrated in FIG. 2D, the second shielding layer 130d is formed on the same layer as the second electrode 43 of the capacitor Cst. The second electrode 43 of the capacitor Cst and the second shielding layer 130d may be positioned on the third insulating layer 13.

The first shielding layer 120 may include metal and may have a single layer or multi-layer structure. The second shielding layer 130d may include the same material as that of the second electrode 43. The fourth insulating layer 14 may be positioned on the second electrode 43 and the second shielding layer 130d.

Each of the first shielding layer 120 and the second shielding layers 130a, 130b, 130c, and 130d illustrated in FIGS. 2A, 2B, 2C, and 2D may be electrically connected to different conductive layers so that different voltages may be applied to the first shielding layer 120 and the second shielding layers 130a, 130b, 130c, and 130d from the conductive layers. The conductive layers may be electrodes of the circuit devices within the pixel PX, or wirings for applying signal or voltage to the pixel PX.

In an exemplary embodiment, the first transistor M1 illustrated in FIGS. 2A, 2B, 2C, and 2D may be a p-channel transistor, and the second transistor M2 illustrated in FIGS. 2A, 2B, 2C, and 2D may be an n-channel transistor. In this case, the first shielding layer 120 may be electrically connected to a power line electrically connected to a positive (+) constant voltage source or a power line electrically connected to a negative (−) constant voltage source. Each of the second shielding layers 130a, 130b, 130c, and 130d may be electrically connected to the second gate electrode 32 of the second transistor M2 or the power line electrically connected to the negative (−) constant voltage source.

In another exemplary embodiment, the first transistor M1 illustrated in FIGS. 2A, 2B, 2C, and 2D may be an n-channel transistor, and the second transistor M2 illustrated in FIGS. 2A, 2B, 2C, and 2D may be an n-channel transistor. In this case, the first shielding layer 120 may be electrically connected to the first gate electrode 22 or the first source electrode 23 of the first transistor M1 or the power line electrically connected to the negative (−) constant voltage source. Each of the second shielding layers 130a, 130b, 130c, and 130d may be electrically connected to the second gate electrode 32 of the second transistor M2 or the power line electrically connected to the negative (−) constant voltage source.

In another exemplary embodiment, the first shielding layer 120 and the second shielding layers 130a, 130b, 130c, and 130d illustrated in FIGS. 2A, 2B, 2C, and 2D may also be electrically floated.

When the same voltage is applied to the first shielding layer 120 and the second shielding layers 130a, 130b, 130c and 130d illustrated in FIGS. 2A, 2B, 2C, and 2D or the first shielding layer 120 and the second shielding layers 130a, 130b, 130c and 130d illustrated in FIGS. 2A, 2B, 2C, and 2D are electrically floated, the first shielding layer 120 and the second shielding layers 130a, 130b, 130c, and 130d may be electrically connected to each other. At this time, the first shielding layer 120 and the second shielding layer 130a may not be separated from each other but may be integrally formed.

Figure 3A:
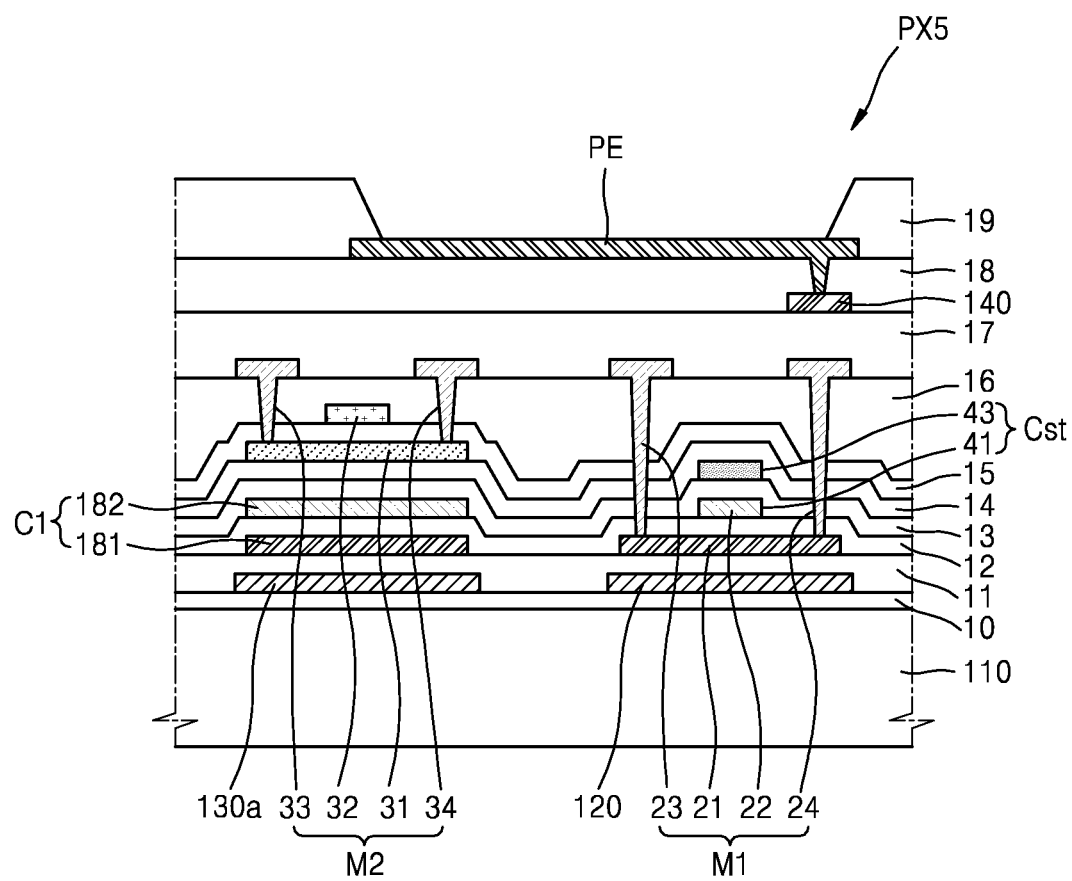
FIGS. 3A, 3B, and 3C are cross-sectional views illustrating a pixel structure constructed according to another exemplary embodiment.
Figure 3B:
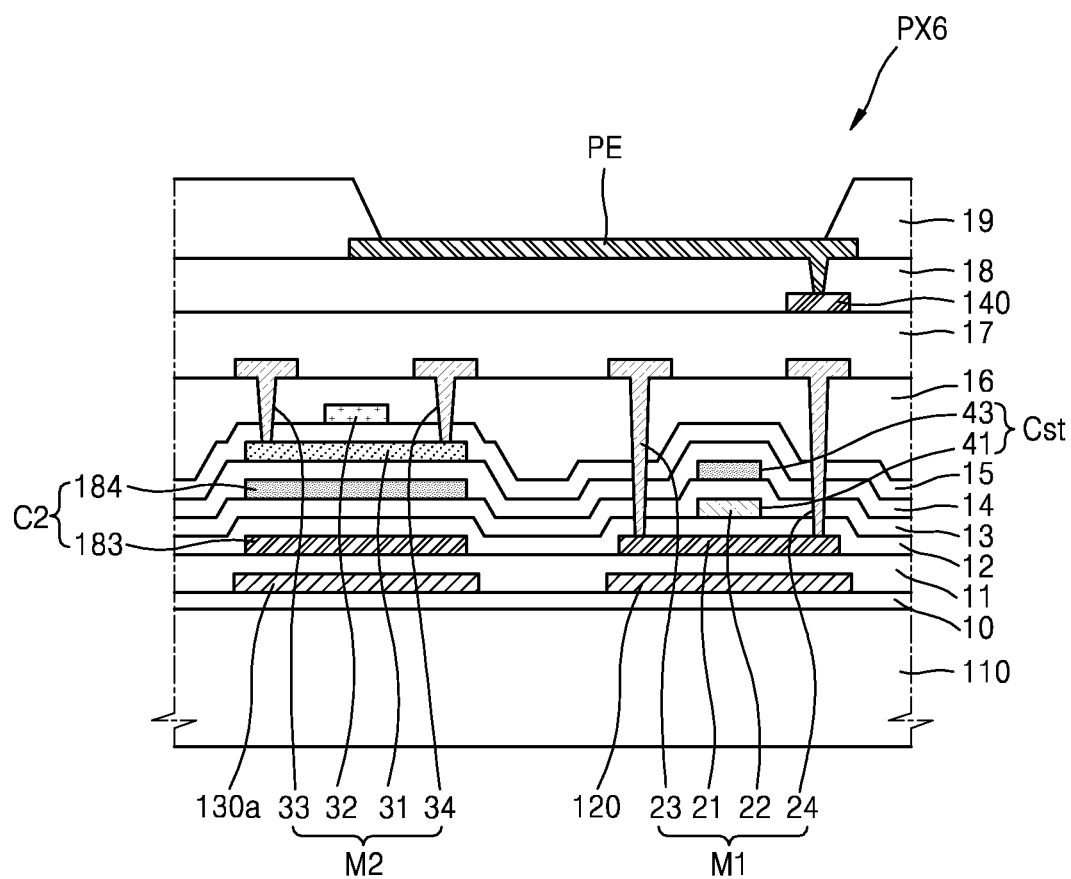
Figure 3C:
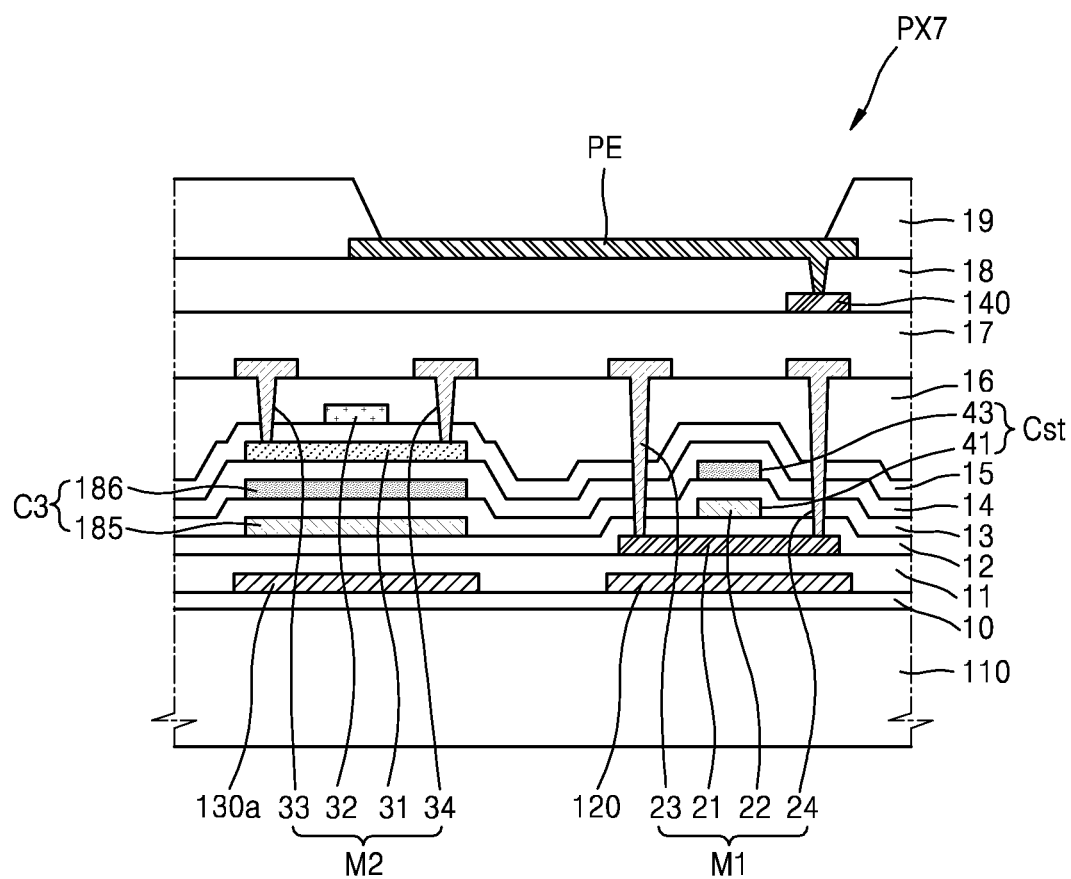

FIGS. 3A, 3B, and 3C are cross-sectional views illustrating a pixel structure constructed according to another exemplary embodiment. Pixels illustrated in FIGS. 3A, 3B, and 3C are different from the pixel PX1 illustrated in FIG. 2A due to a capacitor C configured to further improve optical characteristics of the second transistor M2 and provided below the second transistor M2. Hereinafter, a redundant description of FIG. 2A will be omitted, and differences thereof will be described.

In a pixel PX5 illustrated in FIG. 3A, a first capacitor C1 may be provided between the second transistor M2 and the second shielding layer 130a. The first capacitor C1 may include a lower electrode 181 and an upper electrode 182. The lower electrode 181 may be positioned on the first insulating layer 11, and the upper electrode 182 may be positioned on the second insulating layer 12. The lower electrode 181 may include the same material as a material for forming the first semiconductor layer 21 of the first transistor M1. The upper electrode 182 may include the same material as a material for forming the first gate electrode 22 of the first transistor M1.

The upper electrode 182 of the first capacitor C1 may be electrically connected to the second shielding layer 130a, and the lower electrode 181 of the first capacitor C1 may be electrically floated. In another exemplary embodiment, both of the upper electrode 182 and the lower electrode 181 of the first capacitor C1 may be electrically floated.

In a pixel PX6 illustrated in FIG. 3B, a second capacitor C2 may be provided between the second transistor M2 and the second shielding layer 130a. The second capacitor C2 may include a lower electrode 183 and an upper electrode 184. The lower electrode 183 may be positioned on the first insulating layer 11, and the upper electrode 184 may be positioned on the third insulating layer 13. The lower electrode 183 may include the same material as a material for forming the first semiconductor layer 21 of the first transistor M1. The upper electrode 184 may include the same material as a material for forming the second electrode 43 of the capacitor Cst.

The upper electrode 184 of the second capacitor C2 may be electrically connected to the second shielding layer 130a, and the lower electrode 183 of the second capacitor C2 may be electrically floated. In another exemplary embodiment, both of the upper electrode 184 and the lower electrode 183 of the second capacitor C2 may be electrically floated.

In a pixel PX7 illustrated in FIG. 3C, a third capacitor C3 may be provided between the second transistor M2 and the second shielding layer 130a. The third capacitor C3 may include a lower electrode 185 and an upper electrode 186. The lower electrode 185 may be positioned on the second insulating layer 12, and the upper electrode 186 may be positioned on the third insulating layer 13. The lower electrode 185 may include the same material as a material for forming the first gate electrode 22 of the first transistor M1. The upper electrode 186 may include the same material as a material for forming the second electrode 43 of the capacitor Cst.

The upper electrode 186 of the third capacitor C3 may be electrically connected to the second shielding layer 130a, and the lower electrode 185 of the third capacitor C3 may be electrically floated. In another exemplary embodiment, both of the upper electrode 186 and the lower electrode 185 of the third capacitor C3 may be electrically floated.

Figure 4A:
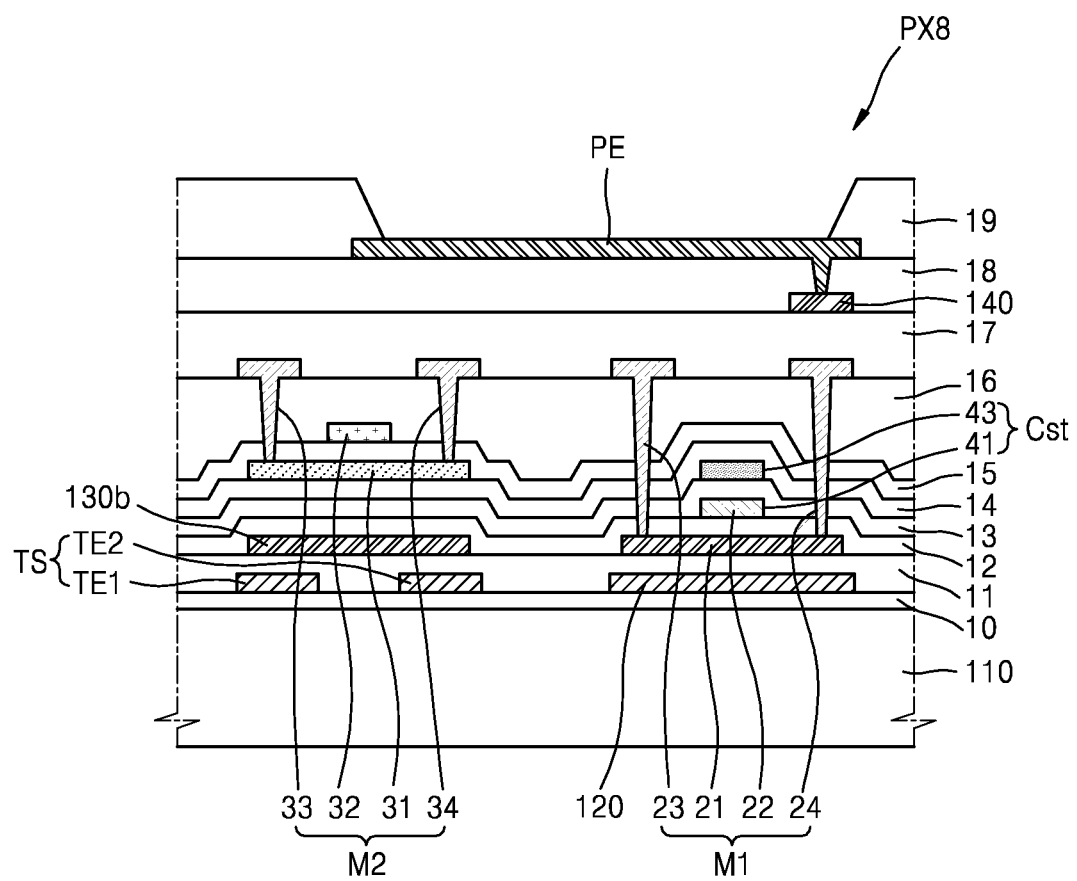
FIGS. 4A, 4B, and 4C are cross-sectional views illustrating a pixel structure constructed according to another exemplary embodiment.
Figure 4B:
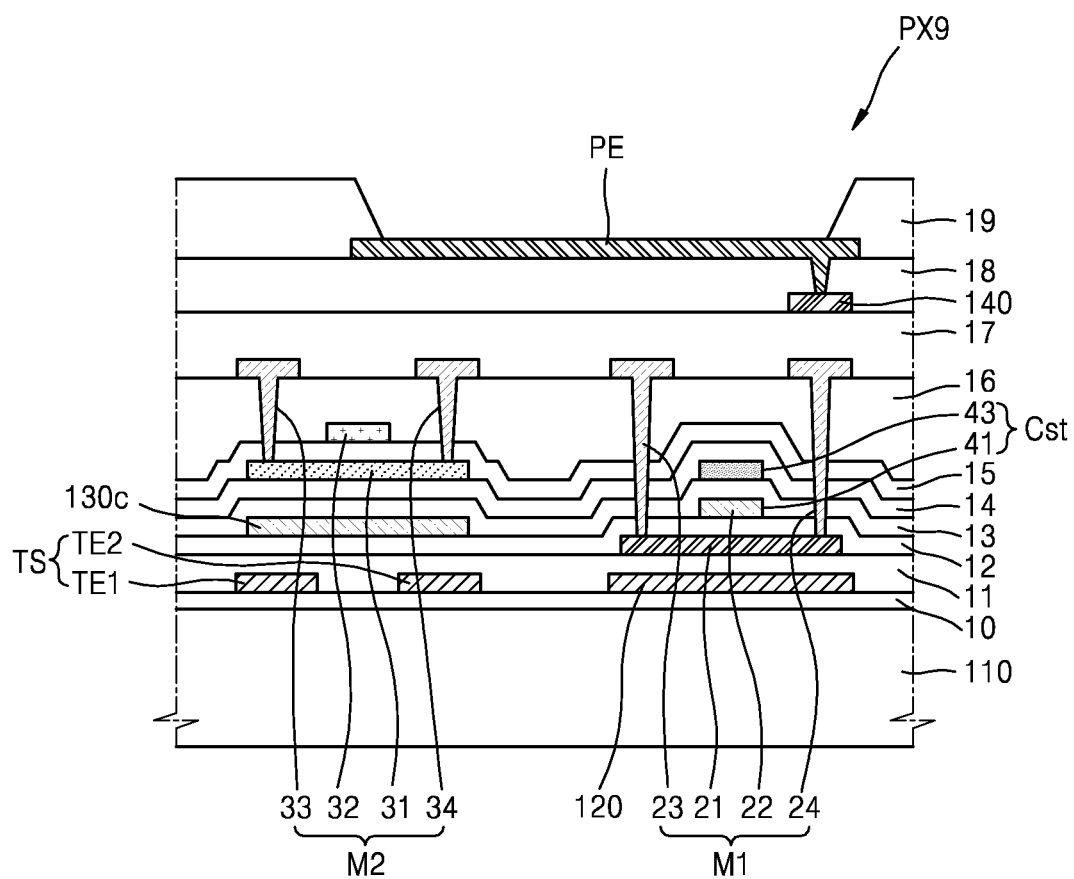
Figure 4C:
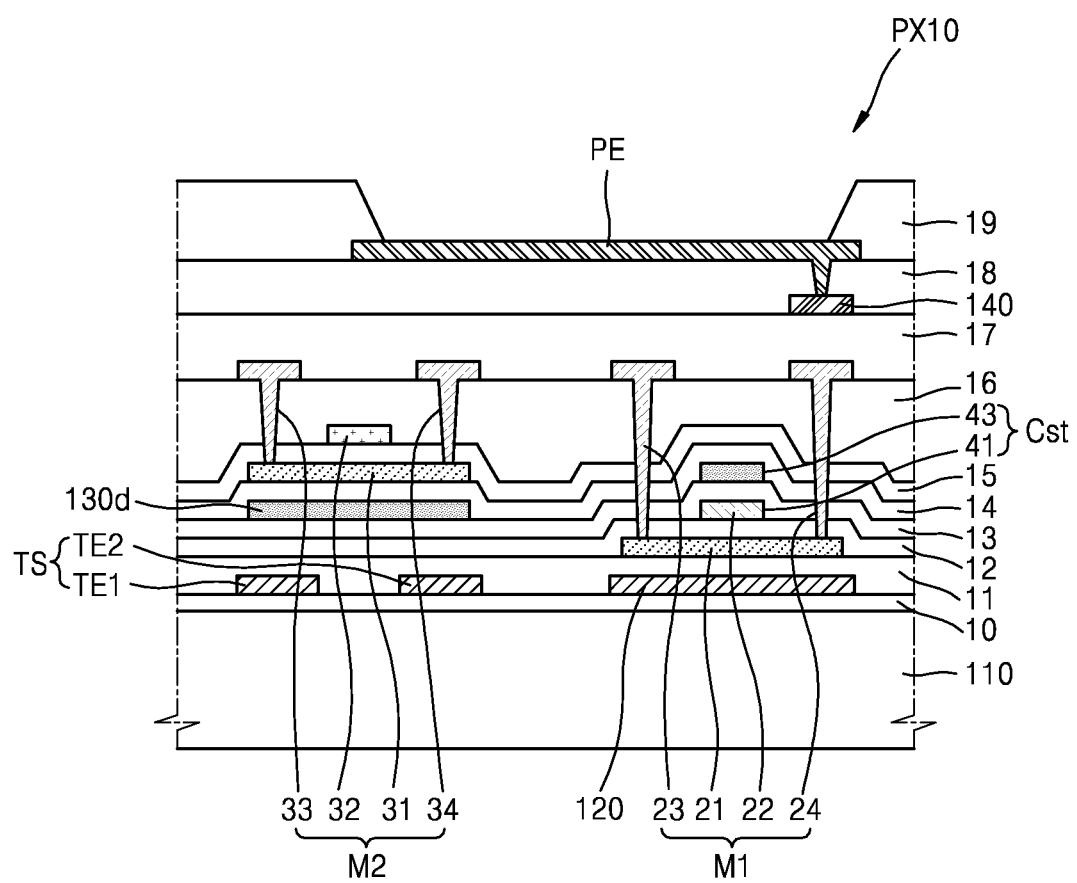

FIGS. 4A, 4B, and 4C are cross-sectional views illustrating a pixel structure constructed according to an exemplary embodiment. In pixels illustrated in FIGS. 4A, 4B, and 4C, a touch sensor TS is provided below the second transistor M2. Hereinafter, a redundant description of FIG. 2A will be omitted, and differences thereof will be described.

In pixels PX8, PX9, and PX10 illustrated in FIGS. 4A, 4B, and 4C, the touch sensor TS may be positioned below the second transistor M2. The touch sensor TS may include a first touch electrode TE1 and a second touch electrode TE2, which are positioned above the buffer layer 10 and apart from each other. The first touch electrode TE1 and the second touch electrode TE2 may include the same material as a material for forming the first shielding layer 120 below the first transistor M1. Each of the first touch electrode TE1 and the second touch electrode TE2 may be one of a transmission electrode and a reception electrode.

Referring to FIG. 4A, a second shielding layer 130b may be positioned on the touch sensor TS. That is, the second shielding layer 130b may be positioned between the touch sensor TS and the second transistor M2. The second shielding layer 130b may be positioned on the first insulating layer 11 and formed of the same material as a material forming the first semiconductor layer 21 of the first transistor M1.

Referring to FIG. 4B, a second shielding layer 130c may be positioned on the touch sensor TS. That is, the second shielding layer 130c may be positioned between the touch sensor TS and the second transistor M2. The second shielding layer 130c may be positioned on the second insulating layer 12 and formed of the same material as a material for forming the first gate electrode 22 of the first transistor M1.

Referring to FIG. 4C, a second shielding layer 130d may be positioned on the touch sensor TS. That is, the second shielding layer 130d may be positioned between the touch sensor TS and the second transistor M2. The second shielding layer 130d may be positioned on the third insulating layer 13 and formed of the same material as a material for forming the second electrode 43 of the capacitor Cst.

Figure 5:
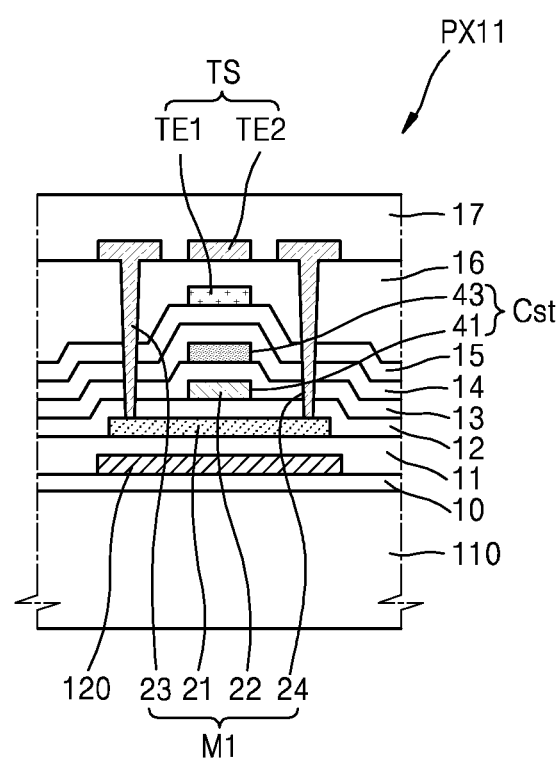
FIG. 5 is a cross-sectional view illustrating a pixel structure constructed according to another exemplary embodiment.

FIG. 5 is a cross-sectional view illustrating a pixel structure constructed according to an exemplary embodiment. In a pixel illustrated in FIG. 5, the touch sensor TS is provided above the first transistor M1. Hereinafter, a redundant description of FIG. 2A will be omitted, and differences thereof will be described.

In a pixel PX11 illustrated in FIG. 5, a first touch electrode TE1 may be positioned above the fifth insulating layer 15, and a sixth insulating layer 16 may be positioned above the first touch electrode TE1, and a second touch electrode TE2 may be positioned above the second insulating layer 16. Each of the first touch electrode TE1 and the second touch electrode TE2 may be one of a transmission electrode and a reception electrode.

Figure 6A:
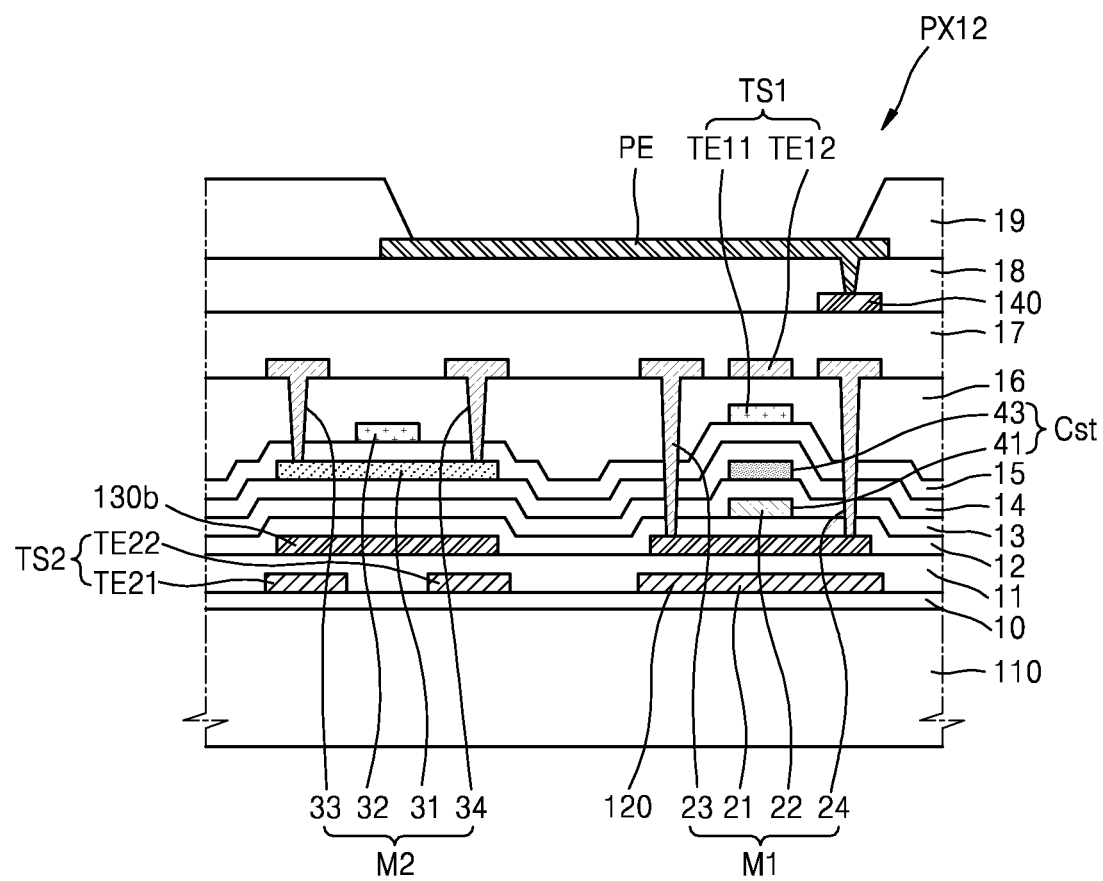
FIGS. 6A, 6B, and 6C are cross-sectional views illustrating a pixel structure constructed according to another exemplary embodiment.
Figure 6B:
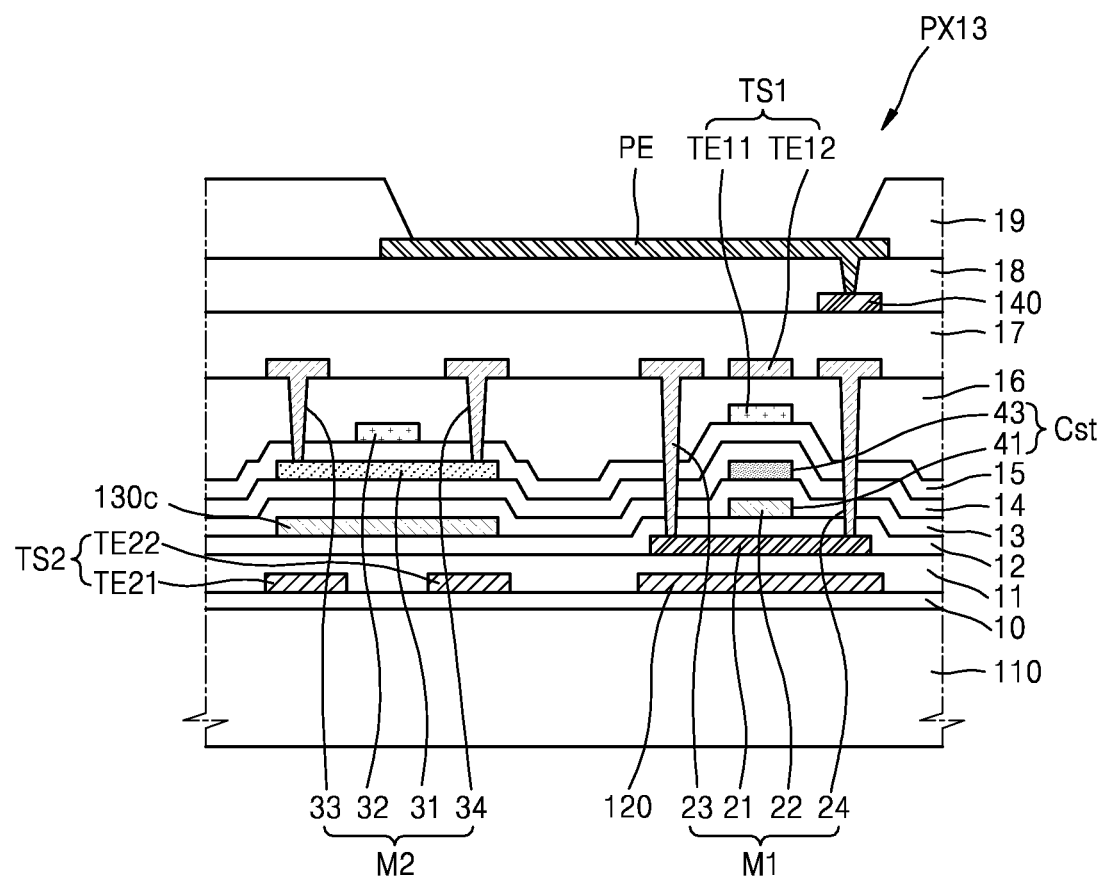
Figure 6C:
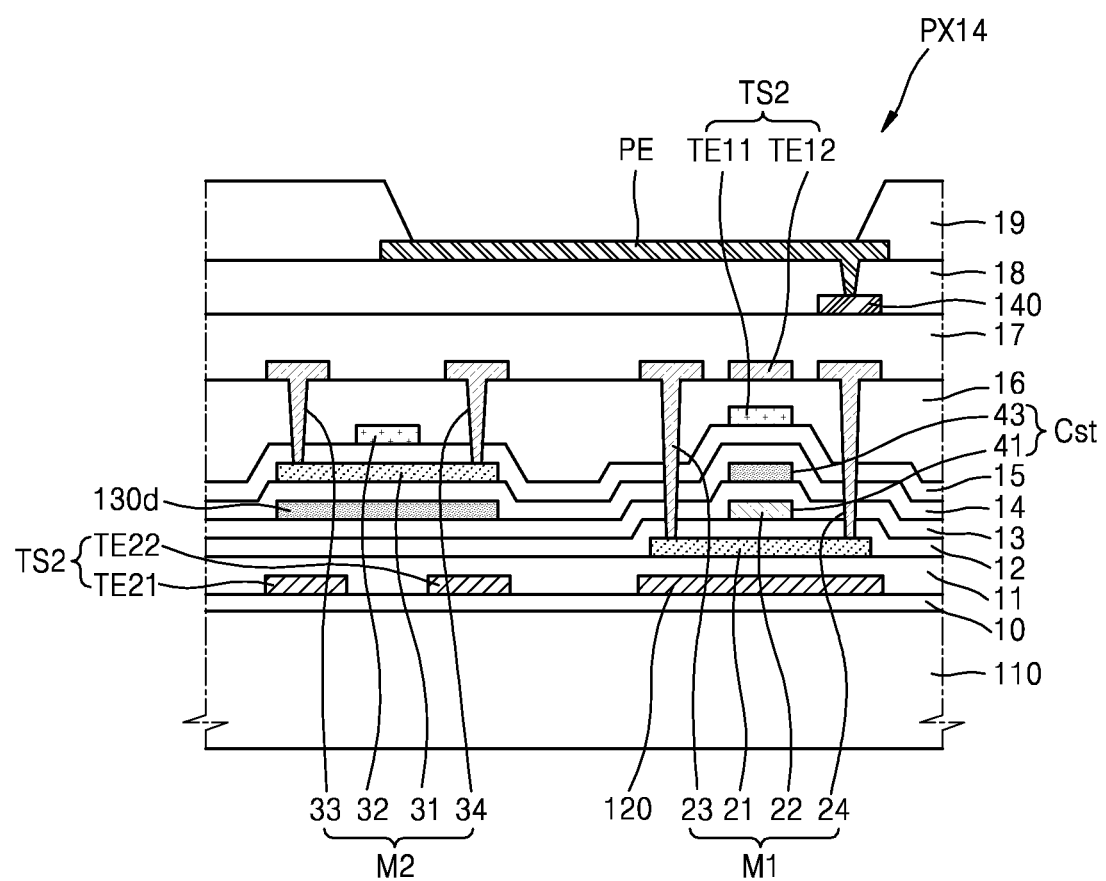

FIGS. 6A, 6B, and 6C are cross-sectional views illustrating a pixel structure constructed according to another exemplary embodiment. In FIGS. 6A, 6B, and 6C, a first touch sensor TS1 is provided below the second transistor M2, and a second touch sensor TS2 is provided above the first transistor M1.

Referring to FIG. 6A, in a pixel PX12, a first shielding layer 120 may be provided below the first transistor M1, and a second shielding layer 130b may be provided below the second transistor M2. The second touch sensor TS2 may be provided below the second shielding layer 130b. The second touch sensor TS2 includes a first touch electrode TE21 and a second touch electrode TE22, which are positioned above the buffer layer 10 and apart from each other, and may be positioned on the same layer as the first shielding layer 120. The first touch sensor TS1 may be provided above the first transistor M1. The first touch sensor TS1 may include the first touch electrode TE11 above the fifth insulating layer 15 and the second touch electrode TE12 above the sixth insulating layer 16.

Referring to FIG. 6B, in a pixel PX13, the first shielding layer 120 may be provided below the first transistor M1, and the second shielding layer 130c may be provided below the second transistor M2. The second touch sensor TS2 may be provided below the second shielding layer 130c. The second touch sensor TS2 may include the first touch electrode TE21 and the second touch electrode TE22, which are positioned above the buffer layer 10 and apart from each other, and may be positioned on the same layer as the first shielding layer 120. The first touch sensor TS1 may be provided above the first transistor M1. The first touch sensor TS1 may include the first touch electrode TE11 above the fifth insulating layer 15 and the second touch electrode TE12 above the sixth insulating layer 16.

Referring to FIG. 6C, in a pixel PX14, the first shielding layer 120 may be provided below the first transistor M1, and the second shielding layer 130d may be provided below the second transistor M2. The second touch sensor TS2 may be provided below the second shielding layer 130d. The second touch sensor TS2 may include the first touch electrode TE21 and the second touch electrode TE22, which are positioned above the buffer layer 10 and apart from each other, and may be positioned on the same layer as the first shielding layer 120. The first touch sensor TS1 may be provided above the first transistor M1. The first touch sensor TS1 may include the first touch electrode TE11 above the fifth insulating layer 15 and the second touch electrode TE12 above the sixth insulating layer 16.

Figure 7:
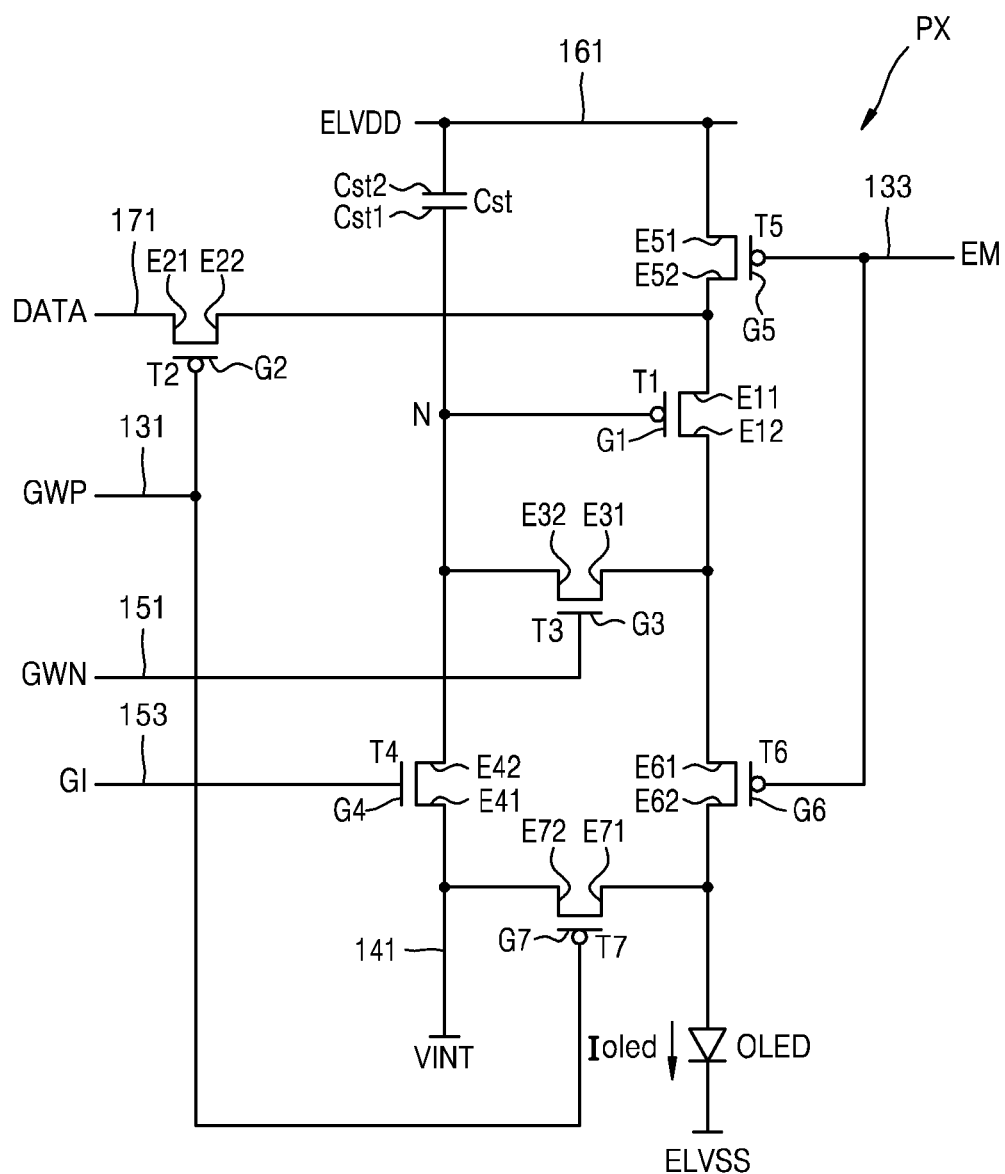
FIG. 7 is an equivalent circuit diagram of pixels illustrated in FIG. 1 according to an exemplary embodiment.

FIG. 7 is an equivalent circuit diagram of the pixels illustrated in FIG. 1 according to an exemplary embodiment.

Referring to FIG. 7, a pixel PX includes a display device and a pixel circuit for driving the display device by receiving signals from a plurality of wirings. Hereinafter, a pixel PX having an OLED as the display device will be described as an exemplary embodiment.

In FIG. 7, a first scan line 131, a light-emitting control line 133, a second scan line 151, a third scan line 153, and a data line 171, an initialization voltage line 141, and a power voltage line 161 are provided in each pixel PX. However, the exemplary embodiments are not limited thereto. In another exemplary embodiment, at least one of the first scan line 131, the light-emitting control line 133, the second scan line 151, the third scan line 153, and the data line 171, the initialization voltage line 141 and the power voltage line 161 may be shared in adjacent pixels.

In an exemplary embodiment, different types of TFTs illustrated in FIGS. 2A, 2B, 2C, 2D, 3A, 3B, 3C, 4A, 4B, 4C, 5, 6A, 6B, and 6C may be applied so that the performance of the pixel PX may be optimized. For example, a driving transistor, for example, T1 may be formed with a silicon transistor, for example, an NMOS silicon transistor or a PMOS silicon transistor, and switching transistors, such as the other transistors, for example, T2, T3, T4, T5, T6, and T7 may be formed with oxide transistors, for example, NMOS oxide transistors, or a combination of NMOS and/or PMOS silicon transistors and NMOS oxide transistors. In another example, the driving transistor, for example, T1 may be formed with an NMOS oxide transistor, and the other transistors, for example, T2, T3, T4, T5, T6, and T7 may be formed with silicon transistors or NMOS and/or PMOS silicon and NMOS oxide transistors.

In FIG. 7, a third transistor T3 and a fourth transistor T4 among a plurality of first through seventh transistors T1, T2, T3, T4, T5, T6, and T7 are NMOS oxide transistors, and the other transistors are PMOS silicon transistors.

The signal lines includes the first scan line 131 for transmitting a first scan signal GWP, the second scan line 151 for transmitting a second scan signal GWN, the third scan line 153 for transmitting a third scan signal GI, the light-emitting control line 133 for transmitting a light-emitting control signal EM, and the data line 171 for transmitting a data signal DATA while intersecting with the first scan line 131.

The power voltage line 161 transmits a first power voltage ELVDD to the first transistor T1, and the initialization voltage line 141 transmits an initialization voltage VINT for initializing the first transistor T1 and the pixel electrode to the pixel PX.

The pixel circuit of the pixel PX may include a plurality of transistors T1 through T7 and the capacitor Cst. The first electrodes E11, E21, E31, E41, E51, E61, and E71 and the second electrodes E12, E22, E32, E42, E52, E62, and E72 of FIG. 7 may be source electrodes (source regions) or drain electrodes (drain regions) according to the type of transistors (p-type or n-type) and/or operating conditions. The first through seventh transistors T1, T2, T3, T4, T5, T6, and T7 may be implemented with TFTs.

The first transistor T1 includes a gate electrode G1 connected to a first electrode Cst1 of the capacitor Cst, the first electrode E11 connected to the power voltage line 161 via the fifth transistor T5, and the second electrode E12 electrically connected to the pixel electrode of the OLED via the sixth transistor T6. The first transistor T1 serves as a driving transistor, receives the data signal DATA according to a switching operation of the second transistor T2 and supplies a current to the OLED.

The second transistor T2 includes a gate electrode G2 connected to the first scan line 131, the first electrode E21 connected to the data line 171, and the second electrode E22 connected to the first electrode E11 of the first transistor T1. The second transistor T2 is turned on according to a second scan signal GWP transmitted via the first scan line 131 and performs a switching operation of transmitting the data signal DATA transmitted from the data line 171 to the first electrode E11 of the first transistor T1.

The third transistor T3 includes a gate electrode G3 connected to the second scan line 151, the first electrode E31 connected to the second electrode E12 of the first transistor T1, the first electrode Cst1 of the capacitor Cst, the second electrode E42 of the fourth transistor T4, and the second electrode E32 connected to the gate electrode G1 of the first transistor T1. The first electrode E31 is connected to the pixel electrode of the OLED via the sixth transistor T6. The third transistor T3 is turned on according to the second scan signal GWN transmitted via the second scan line 151 and diode-connects the first transistor T1.

The fourth transistor T4 includes a gate electrode G4 connected to the third scan line 153, the first electrode E41 connected to the initialization voltage line 141, the first electrode Cst1 of the capacitor Cst, the second electrode E32 of the third transistor T3, and the second electrode E42 connected to the gate electrode G1 of the first transistor T1. The fourth transistor T4 is turned on according to a third scan signal GI transmitted via the third scan line 153 and transmits the initialization voltage VINT to the gate electrode G1 of the first transistor T1, thereby initializing a gate voltage of the first transistor T1.

The fifth transistor T5 includes a gate electrode G5 connected to the light-emitting control line 133, the first electrode E51 connected to the power voltage line 161, and the second electrode E52 connected to the first electrode E11 of the first transistor T1 and the second electrode E22 of the second transistor T2.

The sixth transistor T6 includes a gate electrode G6 connected to the light-emitting control line 133, the first electrode E61 connected to the second electrode E12 of the first transistor T1 and the first electrode E31 of the third transistor T3, and the second electrode E62 connected to the pixel electrode of the OLED.

The fifth transistor T5 and the sixth transistor T6 are simultaneously turned on according to the light-emitting control signal EM transmitted via the light-emitting control line 133 so that a current flows through the OLED.

The seventh transistor T7 includes a gate electrode G7 connected to the first scan line 131, the first electrode E71 connected to the second electrode E62 of the sixth transistor T6 and the pixel electrode of the OLED, and the second electrode E72 connected to the initialization voltage line 141. The seventh transistor T7 is turned on according to the third scan signal GWP transmitted via the first scan line 131 so that a voltage of the pixel electrode of the OLED is initialized.

The capacitor Cst includes the first electrode Cst1 connected to the gate electrode G1 of the first transistor T1 and a second electrode Cst2 connected to the power voltage line 161. The first electrode Cst1 of the capacitor Cst is connected to the second electrode E32 of the third transistor T3 and the second electrode E42 of the fourth transistor T4.

The OLED includes the pixel electrode and a common electrode facing the pixel electrode, and a second power voltage ELVSS may be applied to the common electrode of the OLED. The OLED receives the current from the first transistor T1 and emits light, thereby displaying an image.

Figure 8:
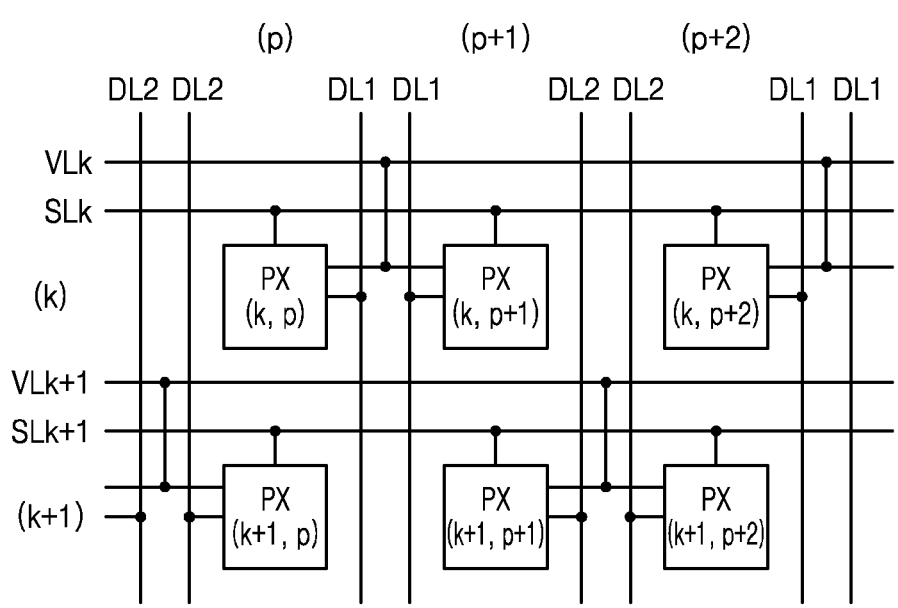
FIG. 8 is a view schematically illustrating a pixel arrangement according to an exemplary embodiment.

FIG. 8 is a view schematically illustrating a pixel arrangement according to an exemplary embodiment.

A pixel PX(k,p) in a k-row and a p-column, a pixel PX(k,p+1) in the k-row and a (p+1)-column, a pixel PX(k,p+2) in the k-row and a (p+2)-column, a pixel PX(k+1,p) in a (k+1)-row and a p-column, a pixel PX(k+1,p+1) in the (k+1)-row and a (p+1)-column, and a pixel PX(k+1,p+1) in the (k+1)-row and the (p+1)-column are shown in FIG. 8. Here, k and p are odd numbers.

Referring to FIG. 8, a pixel circuit of a pixel PX connected to a scan line SLk in an odd row in each column and a pixel circuit of a pixel PX connected to a scan line SLk+1 in an even row in each column may have bilateral symmetric structure. For example, right and left arrangements of first through seventh transistors T1, T2, T3, T4, T5, T6, and T7 of the pixel PX(k,p) and the pixel PX(k+1,p) are opposite to each other, and right and left arrangements of first through seventh transistors T1, T2, T3, T4, T5, T6, and T7 of the pixel PX(k,p+1) and the pixel PX(k+1,p+1) are opposite to each other. However, the connection relationship between the first through seventh transistors T1, T2, T3, T4, T5, T6, and T7 and the capacitor Cst is the same.

Also, pixel circuits of a pair of pixels PX arranged in the same row in adjacent columns may have bilateral symmetry. For example, right and left arrangements of the first through seventh transistors T1, T2, T3, T4, T5, T6, and T7 of the pixel PX(k,p) and the pixel PX(k,p+1) are opposite to each other, and right and left arrangements of the first through seventh transistors T1, T2, T3, T4, T5, T6, and T7 of the pixel PX(k+1,p+1) and the pixel PX(k+1,p+2) are opposite to each other. However, the connection relationship between the first through seventh transistors T1, T2, T3, T4, T5, T6, and T7 and the capacitor Cst is the same. A pair of pixels PX arranged in the same row in adjacent columns may share an initialization voltage line VL.

A first data line DL1 and a second data line DL2 may be apart from each other in each column. A pair of first data lines DL1 and a pair of second data lines DL2 may be adjacent to each other between two adjacent columns. Two data lines DL1 and DL2 in each column includes a first data line DL1 connected to the pixel PX in an odd row and a second data line DL2 connected to the pixel PX in an even row. That is, the pixel PX in the odd row is connected to the first data line DL1, and the pixel PX in the even row is connected to the second data line DL2.

Figure 9:
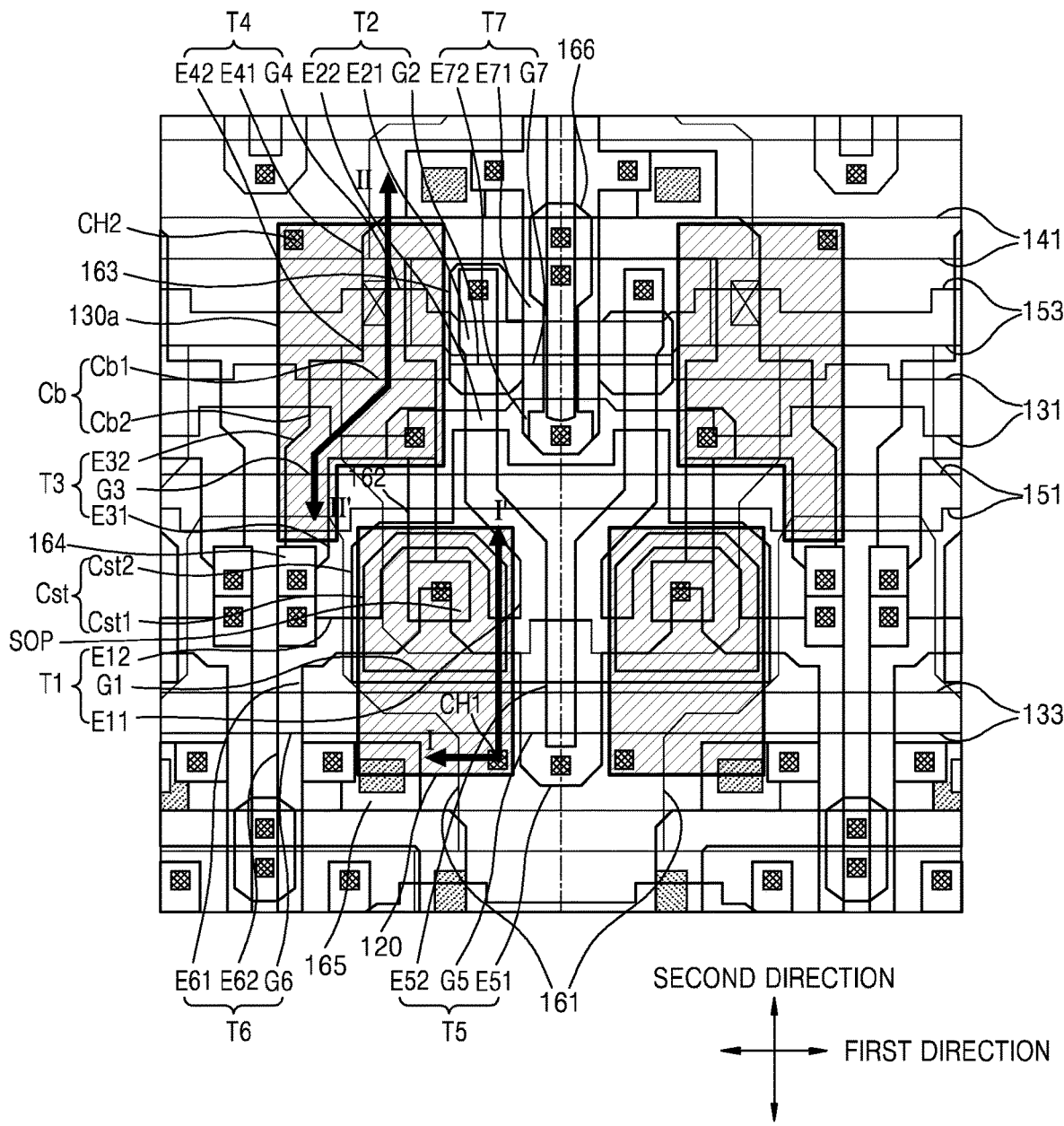
FIG. 9 is a layout view schematically illustrating transistors and capacitors of pixels illustrated in FIG. 7, according to an exemplary embodiment.
Figure 10:
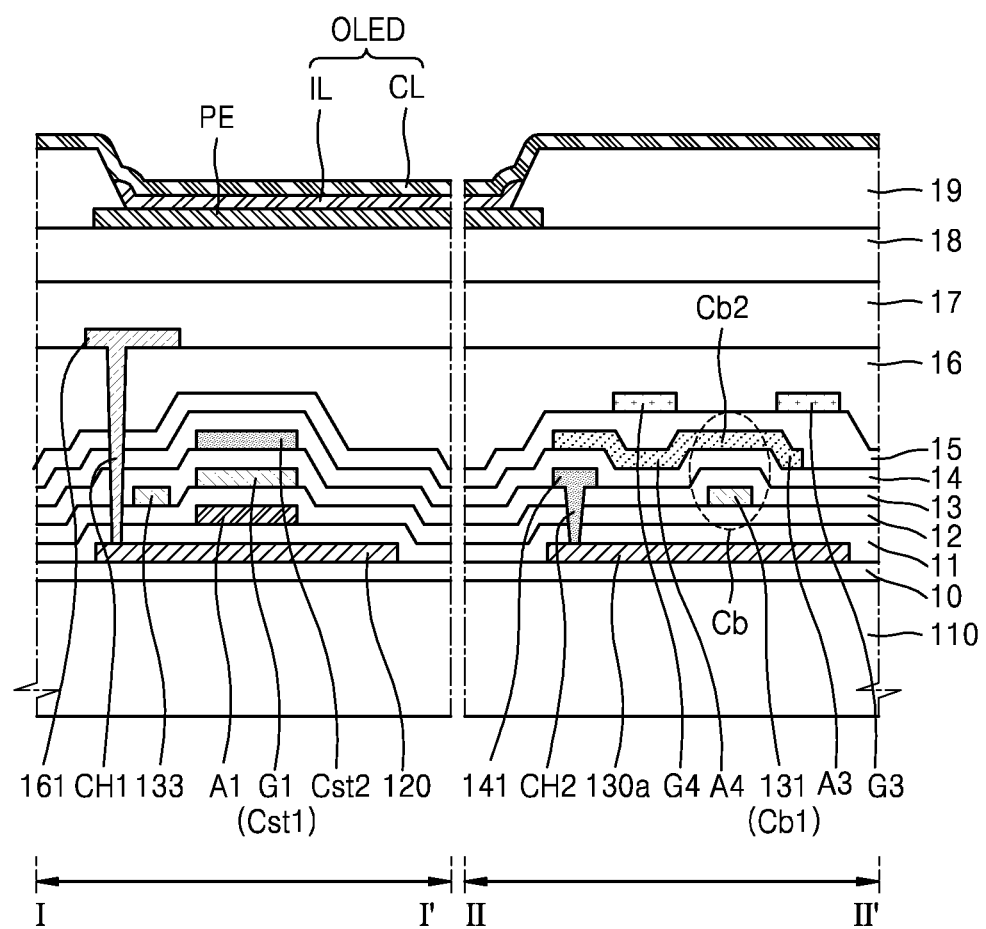
FIG. 10 is a cross-sectional view taken along sectional lines I-I' and II-II' of FIG. 9.

FIG. 9 is a layout view schematically illustrating transistors and capacitors of pixels illustrated in FIG. 7, according to an exemplary embodiment. FIG. 10 is a cross-sectional view taken along sectional lines I-I' and II-II' of FIG. 9.

In FIG. 9, a pair of pixels PX arranged in the same row in adjacent columns are shown. The pair of pixels PX have a bilateral symmetry structure, and positions where the pair of pixels PX are in contact with the initialization voltage line 141, are the same (overlap each other). In FIG. 9, the second shielding layer 130a is an island type in each pixel PX. That is, the second shielding layer 130a of the left pixel PX and the second shielding layer 130a of the right pixel PX are separated from each other. Hereinafter, the left pixel PX in the drawing will be described, and of course, this applies to a right pixel PX.

A pixel PX of the display apparatus according to an exemplary embodiment may include a plurality of wirings extending in a first direction and a plurality of wirings extending in a second direction that intersects with the first direction. The first scan line 131, the second scan line 151, the third scan line 153, the light-emitting control line 133, and the initialization voltage line 141 extend in the first direction. A data line (not shown) and the power voltage line 161 extend in the second direction.

Also, the pixel PX may include first through seventh transistors T1, T2, T3, T4, T5, T6, and T7 and a capacitor Cst. Each of the first through seventh transistors T1, T2, T3, T4, T5, T6, and T7 may include a semiconductor layer including a source region, a drain region, and a channel region between the source region and the drain region, and a gate electrode insulated from the semiconductor layer at a position corresponding to the channel region.

In the current embodiment, the first transistor T1, the second transistor T2, the fifth transistor T5, the sixth transistor T6, and the seventh transistor T7 may be silicon TFTs and p-channel transistors. The third transistor T3 and the fourth transistor T4 may be oxide TFTs and n-channel transistors.

Each of a first electrode and a second electrode of a transistor illustrated in FIG. 9 may be a source electrode (source region) or a drain electrode (drain region).

The buffer layer 10 is positioned above the substrate 110, and the first shielding layer 120 and the second shielding layer 130a are positioned on the buffer layer 10.

The substrate 110 may include a glass material, a ceramic material, a metal material, a plastic material, or a flexible or bendable material. The substrate 110 may have a single layer or multi-layer structure of the above-described materials, and when the substrate 110 has a multi-layer structure, the substrate 110 may further include an inorganic layer. In some exemplary embodiments, the substrate 110 may have a structure of organic/inorganic/organic materials.

The buffer layer 10 may include an oxide layer, such as a silicon oxide (SiOx) and/or a nitride layer, such as silicon nitride (SiNx). The buffer layer 10 may be omitted.

The first shielding layer 120 may be positioned to overlap at least the first transistor T1, and the second shielding layer 130a may be positioned to overlap at least the third transistor T3 and the fourth transistor T4.

The first shielding layer 120 may be electrically connected to the power voltage line 161 electrically connected to the positive (+) constant voltage source via a contact hole CH1 that perforates the first, second, third, fourth, fifth, and sixth insulating layers 11 to 16. The second shielding layer 130a may be electrically connected to the initialization voltage line 141 electrically connected to the negative (−) constant voltage source via a contact hole CH2 that perforates the first, second, and third insulating layers 11 to 13.

The first shielding layer 120 and the second shielding layer 130a may include metal and have a single layer or multi-layer structure. For example, the first shielding layer 120 and the second shielding layer 130a may have a single layer structure including Mo. In another exemplary embodiment, the first shielding layer 120 and the second shielding layer 130a may have a three-layer structure including a first layer including Ti, a second layer including Al, and a third layer including Ti, which are sequentially positioned above the buffer layer 10.

The first insulating layer 11 may be positioned above the first shielding layer 120 and the second shielding layer 130a, and semiconductor layers of the first transistor T1, the second transistor T2, the fifth transistor T5, the sixth transistor T6, and the seventh transistor T7 are positioned above the first insulating layer 11.

The first insulating layer 11 may include an inorganic material including an oxide or nitride. For example, the first insulating layer 11 may include a silicon oxide ($SiO_2$), a silicon nitride (SiNx), a silicon oxynitride (SiON), an aluminum oxide ($Al_2O_3$), a titanium oxide ($TiO_2$), a tantalum oxide ($Ta_2O_5$), a hafnium oxide ($HfO_2$) or a zinc oxide ($ZnO_2$).

The semiconductor layers of the first transistor T1, the second transistor T2, the fifth transistor T5, the sixth transistor T6, and the seventh transistor T7 may be positioned on the same layer and include the same material. For example, the semiconductor layers may include polycrystalline silicon.

The semiconductor layers of the first transistor T1, the second transistor T2, the fifth transistor T5, and the sixth transistor T6 may be connected to one another and bent in various forms. The semiconductor layer of the seventh transistor T7 may be connected to the semiconductor layer of the sixth transistor T6 in the previous row.

Each of the semiconductor layers of the first transistor T1, the second transistor T2, the fifth transistor T5, the sixth transistor T6, and the seventh transistor T7 may include a channel region, a source region, and a drain region at both sides of the channel region. First doping in the channel region and secondary doping in the source region and the drain region in which a gate electrode is used as a mask, may be performed. In an exemplary embodiment, first doping may be omitted.

The second insulating layer 12 may be positioned above the semiconductor layers of the first transistor T1, the second transistor T2, the fifth transistor T5, the sixth transistor T6, and the seventh transistor T7, and gate electrodes G1, G2, G5, G6, and G7 of the first transistor T1, the second transistor T2, the fifth transistor T5, the sixth transistor T6, and the seventh transistor T7 may be positioned above the second insulating layer 12. The first scan line 131 and the light-emitting control line 133 may be formed of the same material as a material for forming the first transistor T1, the second transistor T2, the fifth transistor T5, the sixth transistor T6, and the seventh transistor T7, and the first scan line 131 and the light-emitting control line 133 may extend in the first direction.

The second insulating layer 12 may include an inorganic material including an oxide or nitride. For example, the second insulating layer 12 may include a silicon oxide ($SiO_2$), a silicon nitride (SiNx), a silicon oxynitride (SiON), an aluminum oxide ($Al_2O_3$), a titanium oxide ($TiO_2$), a tantalum oxide ($Ta_2O_5$), a hafnium oxide ($HfO_2$), or a zinc oxide ($ZnO_2$).

The gate electrodes G1, G2, and G5, G6, and G7 may include Mo, copper (Cu), and Ti and have a single layer or multi-layer structure.

The semiconductor layer (A1, see FIG. 10) of the first transistor T1 includes the first electrode E11, the second electrode E12, and a channel region therebetween. The gate electrode G1 of the first transistor T1 overlaps the channel region in a plane. The semiconductor layer A1 of the first transistor T1 has a curve so that the channel region may be formed long and thus a driving range of a gate voltage applied to the gate electrode G1 of the first transistor T1 may be enlarged. Various embodiments of the shape of the semiconductor layer A1 of the first transistor T1, such as ' ⌐ ', ' ㄹ ', 'S', 'M', and 'W'-shapes are possible. The gate electrode G1 of the first transistor T1 is of an island type and overlaps the channel region of the first transistor T1. The second insulating layer 12 is between the gate electrode G1 of the first transistor T1 and the semiconductor layer A1 of the first transistor T1.

The gate electrode G1 of the first transistor T1 is electrically connected to the second electrode E32 of the third transistor T3 and the second electrode E42 of the fourth transistor T4 via a connecting electrode 162. The connecting electrode 162 is provided on the sixth insulating layer 16 and may be in contact with each of the gate electrode G1 of the first transistor T1, the second electrode E32 of the third transistor T3, and the second electrode E42 of the fourth transistor T4 via contact holes that perforate at least the sixth insulating layer 16.

A semiconductor layer of the second transistor T2 includes a first electrode E21, a second electrode E22, and a channel region therebetween. The gate electrode G2 of the second transistor T2 overlaps the channel region in a plane and is formed by a portion of the first scan line 131. The first electrode E21 of the second transistor T2 is electrically connected to a data line (not shown) via a connecting electrode 163. The connecting electrode 163 may be provided on the sixth insulating layer 16 and may be in contact with the first electrode E21 of the second transistor T2 via a contact hole that perforates at least the sixth insulating layer 16. The data line may be formed above the seventh insulating layer 17 on the connecting electrode 163. The data line may be in contact with the connecting electrode 163 via a contact hole of the seventh insulating layer 17. The second electrode E22 of the second transistor T2 is connected to the first electrode E11 of the first transistor T1.

A semiconductor layer of the fifth transistor T5 includes a first electrode E51, a second electrode E52, and a channel region therebetween. The gate electrode G5 of the fifth transistor T5 overlaps the channel region in the plane and is formed by a portion of the light-emitting control line 133. The first electrode E51 of the fifth transistor T5 is electrically connected to the power voltage line 161 via a contact hole that perforates at least the sixth insulating layer 16. The power voltage line 161 may be provided above the sixth insulating layer 16. The second electrode E52 of the fifth transistor T5 is connected to the first electrode E11 of the first transistor T1.

A semiconductor layer of the sixth transistor T6 includes a first electrode E61, a second electrode E62, and a channel region therebetween. The gate electrode G6 of the sixth transistor T6 overlaps the channel region in the plane and is formed by a portion of the light-emitting control line 133. The first electrode E61 of the sixth transistor T6 is connected to the second electrode E12 of the first transistor T1. The first electrode E61 of the sixth transistor T6 is electrically connected to the first electrode E31 of the third transistor T3 via the connecting electrode 164. The connecting electrode 164 may be provided on the sixth insulating layer 16 and may be in contact with the first electrode E31 of the third transistor T3 via a contact hole that perforates at least the sixth insulating layer 16. The first electrode E31 of the third transistor T3 is provided on the fourth insulating layer 14. The second electrode E62 of the sixth transistor T6 is electrically connected to the pixel electrode PE of the OLED via the connecting electrode 165. The connecting electrode 165 may be provided on the sixth insulating layer 16 and may be in contact with the second electrode 62 of the sixth transistor T6 via a contact hole that perforates at least the sixth insulating layer 16.

A semiconductor layer of the seventh transistor T7 includes a first electrode E71, a second electrode E72, and a channel region therebetween. The gate electrode G7 of the seventh transistor T7 overlaps the channel region in the plane and is formed by a portion of the first scan line 131. The second electrode E72 of the seventh transistor T7 is electrically connected to the first electrode E41 of the fourth transistor T4 and the initialization voltage line 141 via the connecting electrode 166. The connecting electrode 166 may be provided on the sixth insulating layer 16 and may be in contact with each of the first electrode E41 of the fourth transistor T4, the second electrode E72 of the seventh transistor T7, and the initialization voltage line 141 via contact holes that perforate at least the sixth insulating layer 16. The first electrode E71 of the seventh transistor T7 is connected to the second electrode E62 of the sixth transistor T6 in the previous row.

The third insulating layer 13 is positioned above gate electrodes G1, G2, and G5, G6, and G7 of the first transistor T1, the second transistor T2, the fifth transistor T5, the sixth transistor T6, and the sixth transistor T7. A second electrode Cst2 of the capacitor Cst is positioned above the third insulating layer 13. The initialization voltage line 141 positioned on the same layer as the upper electrode Cst2 of the capacitor Cst and formed of the same material as a material for forming the upper electrode Cst2 of the capacitor Cst extends in the first direction.

The third insulating layer 13 may include an inorganic material including the above-described oxide or nitride. The second electrode Cst2 of the capacitor Cst may include Mo, Cu, and Ti and may have a single layer or multi-layer structure.

The capacitor Cst overlaps the first transistor T1. The capacitor Cst includes a first electrode Cst1 and a second electrode Cst2. The first electrode Cst1 of the capacitor Cst is a gate electrode G1 of the first transistor T1. That is, it will be understood that the first electrode Cst1 of the capacitor Cst and the gate electrode G1 of the first transistor T1 may be formed as one body. The first electrode Cst1 of the capacitor Cst is separated from an adjacent pixel, has a rectangular shape, and is positioned on the same layer as the first scan line 131 and the light-emitting control line 133 using the same material as a material for forming the first scan line 131 and the light-emitting control line 133. The second electrode Cst2 of the capacitor Cst covers the whole of the first electrode Cst1 in a state in which the third insulating layer 13 is located between the first electrode Cst1 and the second electrode Cst2, and overlaps the first electrode Cst1. In this case, the third insulating layer 13 serves as a dielectric layer of the capacitor Cst. The second electrode Cst2 of the capacitor Cst may include an opening SOP. The opening SOP is formed by removing a portion of the second electrode Cst2 at a position corresponding to a contact hole for exposing a portion of the first electrode Cst1 and may have a closed curve shape. The connecting electrode 162 may be connected to the first electrode Cst1 via a contact hole located in the opening SOP. The second electrode Cst2 may be connected to the power voltage line 161 via the contact hole that perforates at least the sixth insulating layer 16.

Transistors T3 and T4 including an oxide semiconductor may be positioned above the transistors T1, T2, T5, T6, and T7 including a silicon semiconductor and the capacitor Cst.

A fourth insulating layer 14 is positioned above the second electrode Cst2 of the capacitor Cst. The semiconductor layer (A3, see FIG. 10) of the third transistor T3 and the semiconductor layer (A4, see FIG. 10) of the fourth transistor T4 are positioned above the fourth insulating layer 14. The semiconductor layer A3 of the third transistor T3 and the semiconductor layer A4 of the fourth transistor T4 are positioned on the same layer and include the same material. For example, the semiconductor layer may include an oxide semiconductor.

The fourth insulating layer 14 may include an inorganic material including the above-described oxide or nitride.

The semiconductor layer A3 of the third transistor T3 and the semiconductor layer A4 of the fourth transistor T4 may include a channel region and a source region and a drain region at both sides of the channel region. In an example, the source region and the drain region may be regions in which a carrier concentration is improved by plasma treatment. The source region and the drain region may be formed by adjusting the carrier concentration of the oxide semiconductor and making the oxide semiconductor conductive. For example, the source region and the drain region may be formed by increasing the carrier concentration through plasma treatment using a hydrogen (H)-based gas, a fluorine (F)-based gas, or a combination thereof in the oxide semiconductor.

Gate electrodes G3 and G4 of the third transistor T3 and the fourth transistor T4 are positioned on the semiconductor layer A3 of the third transistor T3 and the semiconductor layer A4 of the fourth transistor T4. The fifth insulating layer 15 is positioned between the semiconductor layer A3 and the gate electrode G3 of the third transistor T3 and between the semiconductor layer A4 and the gate electrode G4 of the fourth transistor T4.

The gate electrodes G3 and G4 include Mo, Cu, and Ti and may have a single layer or multi-layer structure.

In the drawings, the fifth insulating layer 15 is positioned on the entire surface of the substrate. However, the fifth insulating layer 15 may be an insulating pattern patterned to correspond to the gate electrodes G3 and G4. For example, the fifth insulating layer 15 may be formed with the insulating pattern using the same mask process as that of the gate electrodes G3 and G4. The fifth insulating layer 15 may include an inorganic material including the above-described oxide or nitride.

A second scan line 151 and a third scan line 153 that are positioned on the same layer as the gate electrodes G3 and G4 of the third transistor T3 and the fourth transistor T4 using the same material, extends in the first direction.

The third transistor T3 includes a semiconductor layer A3 including an oxide semiconductor and a gate electrode G3. The semiconductor layer A3 includes a first electrode E31, a second electrode E32, and a channel region therebetween. The gate electrode G3 of the third transistor T3 overlaps the channel region in the plane and is formed by a portion of the second scan line 151. The first electrode E31 of the third transistor T3 is electrically connected to the first electrode E61 of the sixth transistor T6 via the connecting electrode 164. The second electrode E32 of the third transistor T3 may be bridge-connected to the gate electrode G1 of the first transistor T1 via the connecting electrode 162.

The fourth transistor T4 includes a semiconductor layer A4 including an oxide semiconductor and a gate electrode G4. The semiconductor layer A4 includes a first electrode E41, a second electrode E42, and a channel region therebetween. The gate electrode G4 of the fourth transistor T4 overlaps the channel region in the plane and is formed by a portion of the third scan line 153. The first electrode E41 of the fourth transistor T4 may be in contact with the initialization voltage line 141 via a contact hole. The second electrode E42 of the fourth transistor T4 may be bridge-connected to the gate electrode G1 of the first transistor T1 via the connecting electrode 162.

A boost capacitor Cb may be formed in a region in which the second electrode E32 of the third transistor T3 and the second electrode E42 of the fourth transistor T4 overlap the first scan line 131. The boost capacitor Cb includes a first electrode Cb1 that includes at least a portion of the first scan line 131, protrudes from the first scan line 131 and has a predetermined area, and a second electrode Cb2 that extends from the second electrode E32 of the third transistor T3 and the second electrode E42 of the fourth transistor T4 and overlaps the first electrode Cb1. The second electrode Cb2 may include an oxide semiconductor. The second electrode Cb2 may be electrically connected to the gate electrode G1 of the first transistor T1 via the connecting electrode 162. The boost capacitor Cb may compensate for kick-back of the third transistor T3 and may increase a voltage of the gate electrode G1 of the first transistor T1.

A sixth insulating layer 16 may be positioned above the transistors T3 and T4 including an oxide semiconductor, and the power voltage line 161 and connecting electrodes (162, 163, 164, 165, and 166) may be positioned on the sixth insulating layer 16. The sixth insulating layer 16 may include an inorganic material including the above-described oxide or nitride.

The power voltage line 161 and the connecting electrodes 162, 163, 164, 165, and 166 may be formed of materials having high conductivity, such as metal, a conductive oxide, and the like. For example, the power voltage line 161 and the connecting electrodes 162, 163, 164, 165, and 166 may have a single layer or multi-layer structure including Al, Cu, and Ti. In some exemplary embodiments, the power voltage line 161 and the connecting electrodes 162, 163, 164, 165, and 166 may be provided with a triple layer of Ti/Al/Ti, which are sequentially positioned.

A seventh insulating layer 17 may be positioned on the power voltage line 161 and the connecting electrodes 162, 163, 164, 165, and 166, and a data line and a conductive layer may be positioned on the seventh insulating layer 17. The data line may extend in the second direction. The data line may be positioned at the left or right of the pixel PX. The data line may be positioned at the left or right of the first transistor T1. The data line may be a first data line DL1 or second data line DL2. A via hole for exposing a portion of the connecting electrode 165 may be formed in the seventh insulating layer 17. The conductive layer may be in contact with the connecting electrode 165 through a via hole.

The seventh insulating layer 17 may include an organic material, such as acryl, benzocyclobutene (BCB), polyimide or hexamethyldisiloxane (HMDSO). In another exemplary embodiment, the seventh insulating layer 17 may include the above-described inorganic material.

The data line and the conductive layer may be formed of materials having high conductivity, such as metal, a conductive oxide, and the like. For example, the data line and the conductive layer may have a single layer or multi-layer structure including Al, Cu, and Ti.

An eighth insulating layer 18 may be positioned on the data line and the conductive layer. A via hole for exposing a portion of the conductive layer may be formed in the eighth insulating layer 18.

The eighth insulating layer 18 may include an organic material, such as acryl, BCB, polyimide or HMDSO. In another exemplary embodiment, the eighth insulating layer 18 may include the above-described inorganic material. The eighth insulating layer 18 serves as a protective layer for covering the transistors T1, T2, T3, T4, T5, T6, and T7 and is formed so that a top surface of the eighth insulating layer 18 is planarized. The eighth insulating layer 18 may have a single layer or multi-layer structure.

The OLED may be located above the eighth insulating layer 18. The OLED may include a pixel electrode PE, a counter electrode CE facing the pixel electrode PE, and an intermediate layer IL between the pixel electrode PE and the counter electrode CE. A ninth insulating layer 19 is positioned on the eighth insulating layer 18 and covers edges of the pixel electrode PE. The ninth insulating layer 19 has an opening for exposing a portion of the pixel electrode PE, thereby defining pixels.

The pixel electrode PE of the OLED may be in contact with the conductive layer electrically connected to the connecting electrode 165 through a via hole. The pixel electrode PE may be a reflective layer including a reflection conductive material, such as silver (Ag), magnesium (Mg), Al, platinum (Pt), lead (Pd), gold (Au), nickel (Ni), neodymium (Nd), iridium (Ir), chrome (Cr), and a compound thereof. In an exemplary embodiment, the pixel electrode PE may be a transparent conductive layer including at least one transparent conductive oxide selected from the group consisting of an indium tin oxide (ITO), an indium zinc oxide (IZO), a zinc oxide (ZnO), an indium oxide ($In_2O_3$), an indium gallium oxide (IGO), and an aluminum zinc oxide (AZO). In an exemplary embodiment, the pixel electrode PE may have a stack structure of the reflective layer and the transparent conductive layer.

The ninth insulating layer 19 may include an organic material, such as acryl, BCB, polyimide or HMDSO.

The intermediate layer IL of the OLED includes at least an emissive layer (EML) and may further include one or more functional layers selected from the group consisting of a hole injection layer (HIL), a hole transport layer (HTL), an electron transport layer (ETL), and an electron injection layer (EIL). The EML may be a red EML, green EML or blue EML. In another exemplary embodiment, the EML may have a multi-layer structure in which the red EML, the green EML, and the blue EML are stacked, so as to emit white light, or a single layer structure including a red light-emitting material, a green light-emitting material, and a blue light-emitting material.

The counter electrode CE of the OLED may be formed of various conductive materials. For example, the counter electrode CE may include a semitransparent reflective layer including at least one selected from the group consisting of lithium (Li), calcium (Ca), fluorine lithium (LiF), Al, Mg, and Ag, or a light-transmitting metal oxide, such as ITO, IZO and ZnO and may include a single layer or a plurality of layers.

A thin-film encapsulation layer (not shown) may be positioned on the OLED. The thin-film encapsulation layer may cover a display area DA and may extend to an outside of the display area DA. The thin-film encapsulation layer may include an inorganic encapsulation layer formed of at least one inorganic material and an organic encapsulation layer formed of at least one organic material. In some exemplary embodiments, the thin-film encapsulation layer may have a stack structure of a first inorganic encapsulation layer/an organic encapsulation layer/a second inorganic encapsulation layer.

Also, a spacer for preventing or reducing mask stamping may be further positioned on the ninth insulating layer 19, and various functional layers, such as a polarization layer for reducing external light reflection, a black matrix, a color filter, and/or a touch screen layer including a touch electrode, may be provided on the thin-film encapsulation layer.

Figure 11:
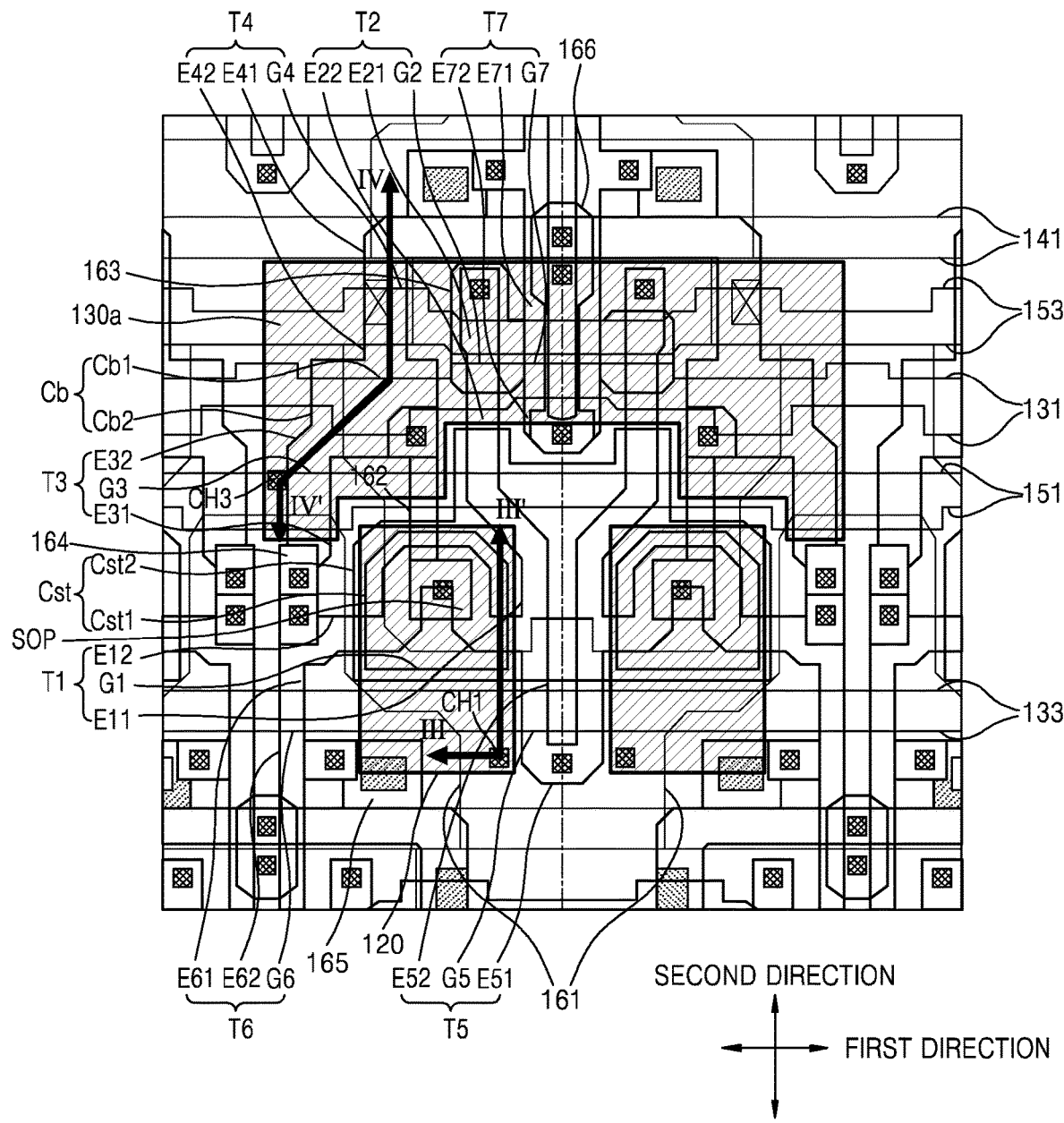
FIG. 11 is a layout view schematically illustrating transistors and capacitors of pixels illustrated in FIG. 7, according to another exemplary embodiment.
Figure 12:
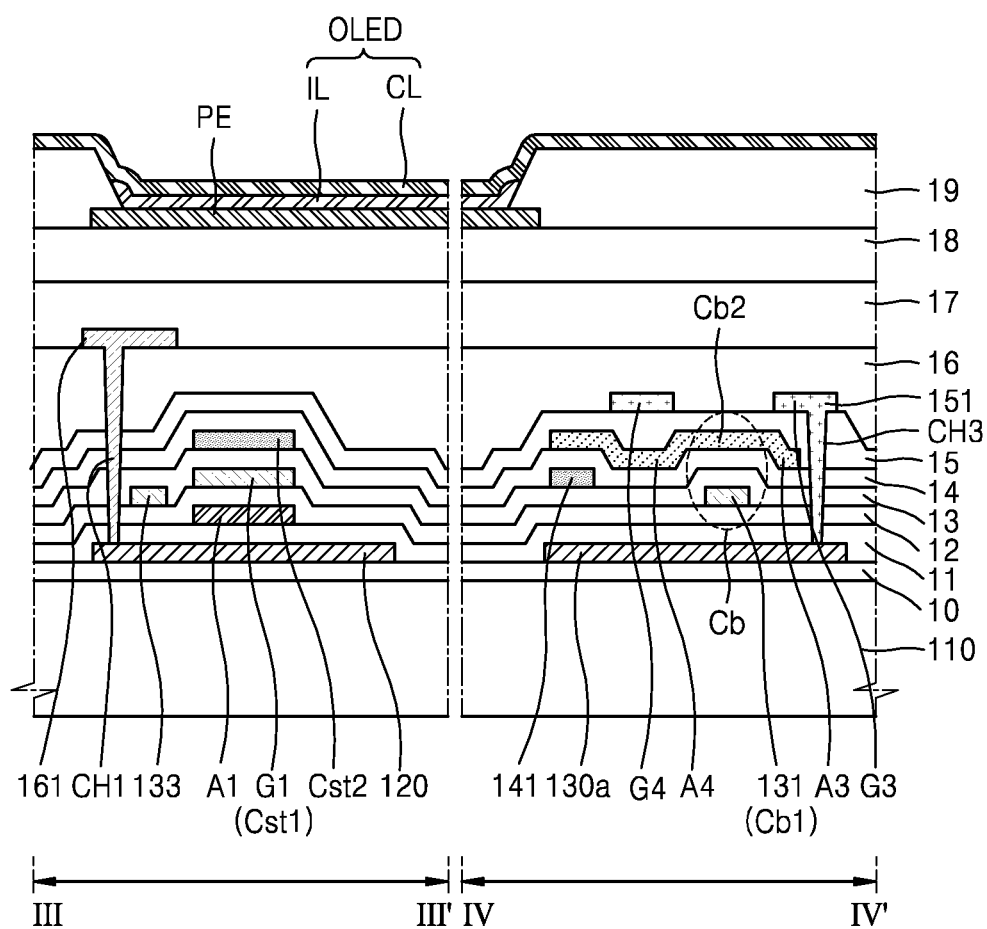
FIG. 12 is a cross-sectional view taken along sectional lines III-III' and IV-IV' of FIG. 11.

FIG. 11 is a layout view schematically illustrating transistors and capacitors of pixels illustrated in FIG. 7, according to another exemplary embodiment. FIG. 12 is a cross-sectional view taken along sectional lines III-III' and IV-IV' of FIG. 11.

A pixel PX of a display apparatus illustrated in FIGS. 11 and 12 is different from the pixel PX of the display apparatus illustrated in FIGS. 9 and 10 in that a second shielding layer 130a below the third transistor T3 and the fourth transistor T4 is electrically connected to a second scan line 151 via a contact hole CH3 that perforates first, second, third, fourth, and fifth insulating layers 11, 12, 13, 14, and 15. A portion of the second scan line 151 functions as a gate electrode G3 of the third transistor T3. Thus, the same voltage as a voltage applied to the gate electrode G3 of the third transistor T3 is applied to the second shielding layer 130a. In FIG. 11, the second shielding layer 130a of the left pixel PX and the second shielding layer 130a of the right pixel PX are connected to each other as one body. That is, the left pixel PX and the right pixel PX may share the second shielding layer 130a. And thus the second shielding layer 130a may be connected to the second scan line 151 via one contact hole CH3 of one of the left pixel PX and the right pixel PX.

In another exemplary embodiment, the second shielding layer 130a may be electrically connected to the third scan line 153 via a contact hole that perforates the first, second, third, fourth, and fifth insulating layers 11, 12, 13, 14, and 15. A portion of the third scan line 153 functions as a gate electrode G4 of the fourth transistor T4. Thus, the same voltage as a voltage applied to the gate electrode G4 of the fourth transistor T4 is applied to the second shielding layer 130a.

Figure 13:
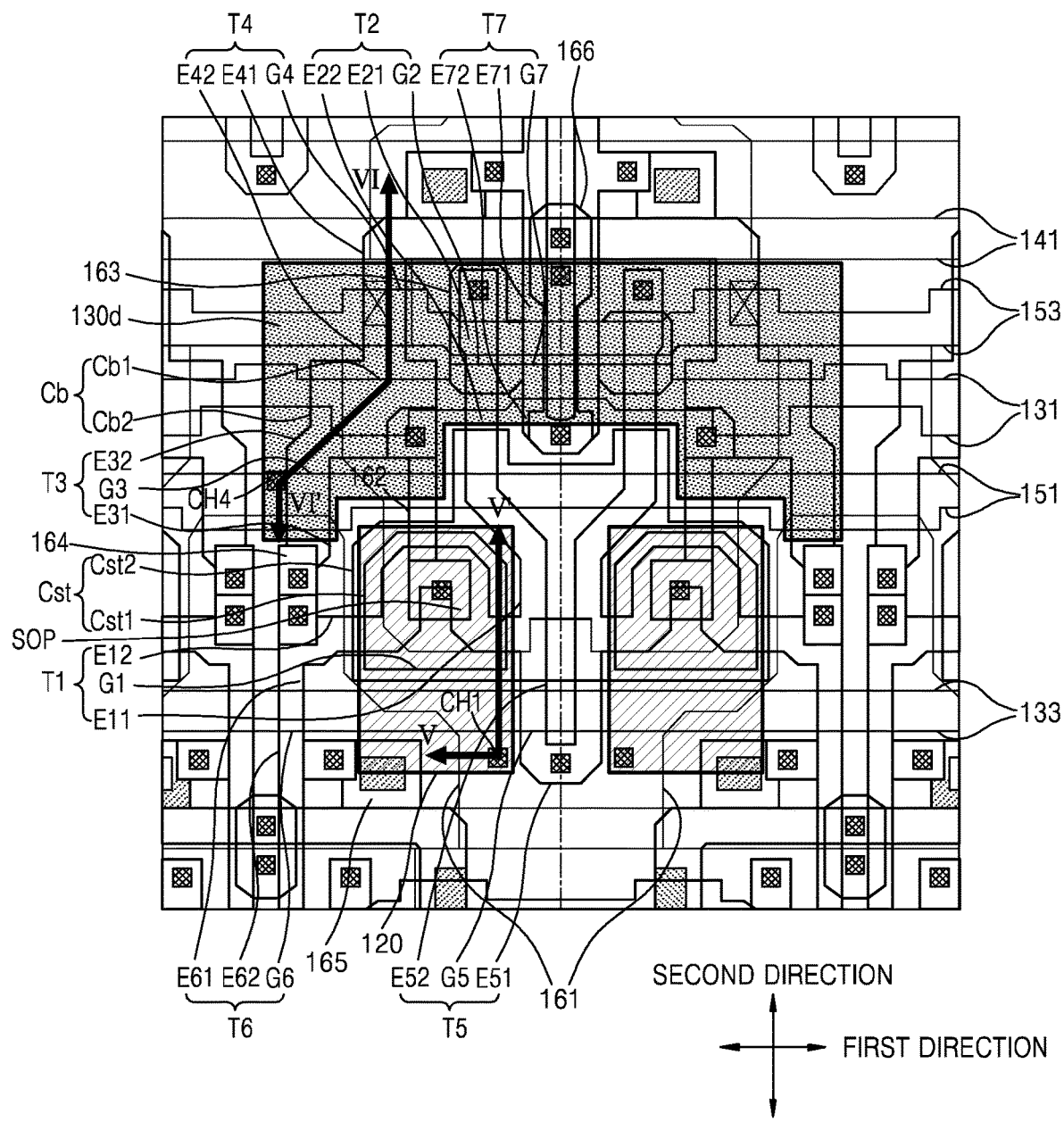
FIG. 13 is a layout view schematically illustrating transistors and capacitors of pixels illustrated in FIG. 7, according to another exemplary embodiment.
Figure 14:
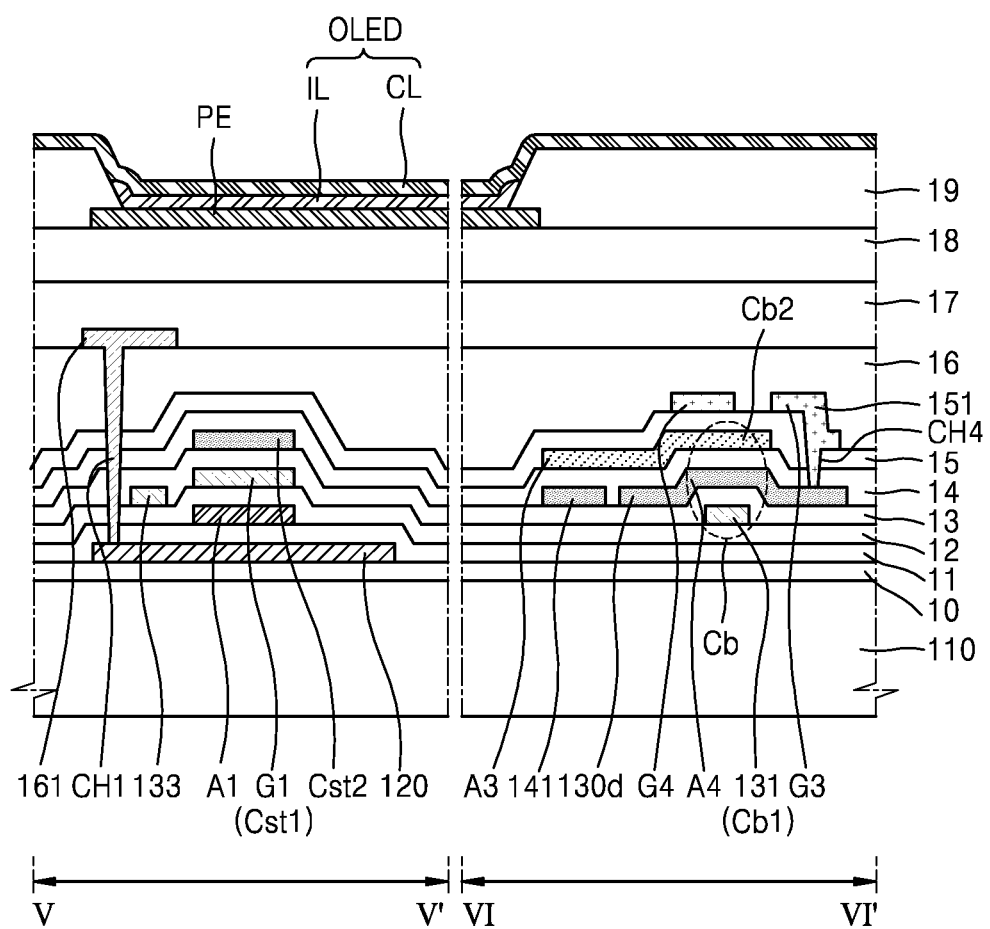
FIG. 14 is a cross-sectional view taken along sectional lines V-V' and VI-VI' of FIG. 13.

FIG. 13 is a layout view schematically illustrating transistors and capacitors of pixels illustrated in FIG. 7, according to another exemplary embodiment. FIG. 14 is a cross-sectional view taken along sectional lines V-V' and VI-VI' of FIG. 13.

A pixel PX of a display apparatus illustrated in FIGS. 13 and 14 is different from the pixel PX of the display apparatus illustrated in FIGS. 9 and 10 in that a second shielding layer 130d below the third transistor T3 and the fourth transistor T4 is positioned on the same layer as the second electrode Cst2 of the capacitor Cst and is electrically connected to the second scan line 151 via a contact hole CH4 that perforates the third through fifth insulating layers 13, 14, and 15. The second shielding layer 130d may include the same material as a material for forming the second electrode Cst2 of the capacitor Cst. A portion of the second scan line 151 functions as the gate electrode G3 of the third transistor T3. Thus, the same voltage as a voltage applied to the gate electrode G3 of the third transistor T3 is applied to the second shielding layer 130d. In FIG. 13, the second shielding layer 130d of the left pixel PX and the second shielding layer 130d of the right pixel PX are connected to each other as one body. That is, the left pixel PX and the right pixel PX may share the second shielding layer 130d. And thus the second shielding layer 130d may be connected to the second scan line 151 via one contact hole CH4 of one of the left pixel PX and the right pixel PX.

In another exemplary embodiment, the second shielding layer 130d may be positioned on the same layer as the second electrode Cst2 of the capacitor Cst and may be electrically connected to the third scan line 153 via a contact hole CH4 that perforates third through fifth insulating layers 13, 14, and 15. A portion of the third scan line 153 functions as the gate electrode G4 of the fourth transistor T4. Thus, the same voltage as a voltage applied to the gate electrode G4 of the fourth transistor T4 is applied to the second shielding layer 130d.

In an exemplary embodiment, the second shielding layer may be positioned on the same layer as the semiconductor layer A1 of the first transistor T1 and may be electrically connected to the initialization voltage line 141 via a contact hole that perforates the second and third insulating layers 12 and 13. In another exemplary embodiment, the second shielding layer may be positioned on the same layer as the semiconductor layer A1 of the first transistor T1 and may be electrically connected to the second scan line 151 or the third scan line 153 via a contact hole that perforates the second through fifth insulating layers 12, 13, 14, and 15.

Also, in another exemplary embodiment, a capacitor may be positioned, as illustrated in FIGS. 3A, 3B, 3C, and 3D, or a touch sensor may be positioned, as illustrated in FIGS. 4A, 4B, and 4C in consideration of positions with other wirings, below the second shielding layer. Of course, a touch sensor may be positioned on the first shielding layer, as illustrated in FIG. 5.

In one or more embodiments, at least one silicon thin-film transistor employing a silicon semiconductor having excellent reliability as a semiconductor layer, and at least one oxide thin-film transistor employing an oxide semiconductor having a low leakage current as a semiconductor layer are used together so that a display apparatus having high reliability and low power consumption may be provided.

Furthermore, in one or more embodiments, a voltage applied to a shielding layer below a transistor is controlled according to a channel type of a transistor and a semiconductor type so that optical characteristics of the transistor may be maintained and/or enhanced and thus a high-quality image may be provided.

The display apparatus according to one or more embodiments has been described as a display apparatus including an organic light-emitting device (OLED) as a display device for convenience. However, the exemplary embodiments are not limited thereto, and the display apparatus according to one or more embodiments may be applied to various types of display apparatuses, such as a liquid crystal display (LCD) apparatus, an electrophoresis display apparatus, an inorganic EL display apparatus, and the like.

The display apparatus according to an exemplary embodiment may be applied to a portable terminal, such as a tablet PC, a smartphone, a personal digital assistant (PDA), a portable multimedia player (PMP), a game device, and a portable terminal, such as a wrist-type watch. The display apparatus is not limited to the portable terminal but may be used in large electronic equipment, such as television (TV) or external advertising board, a personal computer (PC), a notebook, a car navigation unit, and small and medium electronic equipment, such as a camera. Embodiments are not limited to the above-described embodiments but may be employed in other electronic device without departing from the concept of the present disclosure.

According to one or more exemplary embodiments, a display apparatus may include a transistor having improved characteristics, thereby preventing or reducing deterioration in quality of an image which may be caused from employing different types of transistors.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising a pixel in a display area, the pixel comprising:
   a first thin-film transistor (TFT) for driving the pixel, the first TFT comprising a first semiconductor layer comprising a silicon semiconductor;
   a second TFT comprising a second semiconductor layer comprising an oxide semiconductor, one end of the second semiconductor layer being connected to one end of the first semiconductor layer of the first TFT and the other end of the second semiconductor layer being connected to a gate electrode of the first TFT;
   a first shielding layer configured to overlap the first TFT, the first shielding layer interposed between a substrate and the first TFT; and
   a second shielding layer configured to overlap the second TFT, the second shielding layer interposed between the substrate and the second TFT.

2. The display apparatus of claim 1, wherein the first shielding layer and the second shielding layer are positioned on the same layer.

3. The display apparatus of claim 1, wherein the first shielding layer and the second shielding layer are positioned on different layers.

4. The display apparatus of claim 3, wherein the second shielding layer is positioned on the same layer as the first semiconductor layer.

5. The display apparatus of claim 3, wherein the second shielding layer is positioned on the same layer as a gate electrode of the first TFT.

6. The display apparatus of claim 3, further comprising a capacitor overlapping the first TFT, wherein the second shielding layer is positioned on the same layer as one electrode of the capacitor.

7. The display apparatus of claim 1, further comprising a capacitor overlapping the second shielding layer and positioned between the second shielding layer and the second TFT.

8. The display apparatus of claim 7, wherein one electrode of the capacitor is positioned on the same layer as one of the first semiconductor layer of the first TFT and a gate electrode of the first TFT overlapping a channel region of the first semiconductor layer.

9. The display apparatus of claim 1, further comprising at least one of:
   a first touch sensor overlapping the first TFT; and
   a second touch sensor overlapping the second shielding layer and positioned between the second shielding layer and the substrate.

10. The display apparatus of claim 1, wherein the first shielding layer is electrically connected to a power line for applying a power voltage.

11. The display apparatus of claim 1, wherein the first shielding layer is electrically connected to a power line for applying an initialization voltage.

12. The display apparatus of claim 1, wherein the first shielding layer is electrically connected to the first semiconductor layer of the first TFT.

13. The display apparatus of claim 1, wherein the first shielding layer is electrically connected to a gate electrode of the first TFT.

14. The display apparatus of claim 1, wherein the second shielding layer is electrically connected to a power line for applying an initialization voltage.

15. The display apparatus of claim 1, wherein the second shielding layer is electrically connected to a gate electrode of the second TFT.

16. The display apparatus of claim 1, wherein the first TFT is a driving transistor, and the second TFT is a switching transistor.

17. The display apparatus of claim 1, wherein the first TFT is a switching transistor, and the second TFT is a driving transistor.

18. A display apparatus comprising:
- a first thin-film transistor (TFT) comprising a first semiconductor layer including a silicon semiconductor;
- a second TFT comprising a second semiconductor layer including an oxide semiconductor;
- a capacitor configured to overlap the first TFT;
- a first shielding layer including metal overlapping the first TFT, the first shielding layer interposed between a substrate and the first TFT and separated from the first TFT by an insulating layer; and
- a second shielding layer overlapping the second TFT, the second shielding layer interposed between the substrate and the second TFT.

19. The display apparatus of claim 18, wherein the first shielding layer and the second shielding layer are connected to a same voltage source.

20. The display apparatus of claim 18, wherein the first shielding layer and the second shielding layer are connected to different voltage sources.

* * * * *